(12) United States Patent
Takahashi et al.

(10) Patent No.: US 6,410,166 B1
(45) Date of Patent: Jun. 25, 2002

(54) ORGANIC ELECTROLUMINESCENCE DEVICE DOPING DEVICE AND ORGANIC ELECTROLUMINESCENCE DEVICE

(75) Inventors: Hisamitsu Takahashi; Yoshihisa Tsuruoka; Satoshi Tanaka; Toshio Miyauchi, all of Mobara (JP)

(73) Assignee: Futaba Corporation, Mobara (JP)

( * ) Notice: Subject to any disclaimer, the term of this patent is extended or adjusted under 35 U.S.C. 154(b) by 0 days.

(21) Appl. No.: 08/915,080

(22) Filed: Aug. 20, 1997

(30) Foreign Application Priority Data

Aug. 29, 1996 (JP) ............................................. 8-228769

(51) Int. Cl.$^7$ ............................................. H05B 33/14
(52) U.S. Cl. ........................ 428/690; 428/917; 313/504; 313/506
(58) Field of Search ................................. 428/690, 917; 313/502, 504, 506; 549/206, 210, 212, 456, 462, 467, 469, 480, 505, 507

(56) References Cited

PUBLICATIONS

CA 76:67842, Ishii et al., Determination of traces of constituents with Schiff bases. VIII. Extraction–spectrophotometric determination of zinc with N,N'–bissalicylidene–2, 3–diaminobenzofuran, 1971.*
CA 74:27769, Ishii et al., Determination of traces of constituents with Schiff bases. V. Extraction–spectrophotometric determination of traces of nickel with N,N'–bissalicylidene–2,3–diamonobenzofuran, 1970.*
CA 72:74411, Ishii et al., Determination of traces of constituents with Schiff bases. IV. Extraction–spectrophotometric determination of copper with 2,3–bis(salicylideneamino)benzofuran, 1969.*

CA 66:72161, Dagnall et al., Spectrofluorimetric determination of magnesium with N,N'–bis(salicylidene)–2,3–diaminobenzofuran, 1967.*

* cited by examiner

*Primary Examiner*—Marie Yamnitzky
(74) *Attorney, Agent, or Firm*—Oblon, Spivak, McClelland, Maier & Neustadt, P.C.

(57) ABSTRACT

An organic electroluminescence (EL) device doping material which is thermally stable, having a high melting point, and doping with which improves stability of a luminous layer formed as a thin layer. An organic EL device 1 comprises a glass substrate 3, an anode 2 made of transparent indium tin oxide (ITO), an electron hole implanted transporting layer 4 of TPD, a luminous layer 5, and a cathode 6 made of Mg. The luminous layer is made of $Alq_3$ doped with 1 mol % of $Al_2O$ $(SABF)_2$ as a metal chelate complex having ligands composed of SABF skeletons. When plus DC voltage is applied to the anode 2 and minus DC voltage, to the cathode 6, the luminous layer 5 emits yellow electroluminescence of 16400 cd/m$^2$ at maximum with 15 V. The external quantum yield was 0.1891 m/W. The luminous layer of the organic EL device is thermally stable and hard to be deteriorated.

47 Claims, 4 Drawing Sheets

ORGANIC ELECTROLUMINESCENCE DEVICE DOPING DEVICE AND ORGANIC ELECTROLUMINESCENCE DEVICE

BACKGROUND OF THE INVENTION

1. Field of the Invention

The present invention relates to organic electroluminescence device doping material (hereinafter, referred to as organic EL device doping material) suitable for doping a luminous layer of organic electroluminescence device (hereinafter referred to as organic EL device) and organic electroluminescence (EL) device having a luminous layer doped by the organic EL doping material.

2. Description of the Prior Art

An organic EL device has a thin film containing fluorescent organic compound sandwiched by a cathode and an anode. When electrons and electron holes are implanted for re-joining them, excitons are generated, and extinction of the excitons produces light emission (fluorescence, phosphorescence), which is utilized for display.

FIG. 6 shows an example of basic configuration of the organic EL device. This organic EL device is composed of a substrate 100, an anode 101, which is an indium tin oxide (ITO), a hole transporting layer 102 which is a derivative of triphenylamine, an organic luminous layer 103 which is tris (8-quinolinate) aluminum (III), and a cathode 104 which is an alloy of magnesium and silver. These components are stacked on one another in this order. Each of the organic layers has a thickness of about 50 nm. Each of the film-layers is formed by means of vacuum deposition. When voltage of 10 VDC is applied to this organic EL device, a green light emission of about 1000 cd/m$^2$ can be obtained. This light emission is taken out from the ITO side. This organic EL device has a short service life and brightness is reduced to half after about 100 hours.

As for the organic EL devices which were developed prior to the organic EL device illustrated in FIG. 6, luminescence brightness obtained when it is driven by several tens of volts was only several cd/m$^2$. The reason why the aforementioned EL device of FIG. 6 enables a high brightness is considered to be as follows.

1) The organic layer has a thickness as small as 100 nm for employing an organic material which is nearly an insulator in which the carrier movement is in the order of $10^{-3}$ to $10^{-5}$ cm/Vs.

2) A hole transporting layer is provided for isolating a function, thus enhancing rejoining in the luminous layer.

As for the reason why the organic EL device of FIG. 6 has a short service life, the following points are to be taken into consideration.

1) Physical Change of the Organic Layers

A crystalline grain boundary is generated in the organic films, especially in the hole transporting layer 102, which causes a short-circuiting.

2) Cathode 104 Oxidation/Peeling Out

As magnesium having a low work function is used, reaction is caused by humidity and oxygen in the device as well as humidity and oxygen in the air, thus generating oxide.

This significantly lowers electron implantation efficiency, and causes peeling out from the organic layer.

Afterwards, for obtaining multi-coloring the aforementioned organic EL device, a method was developed as follows. A coloring matter, or a pigment, such as coumarin and DCM was doped into the aforementioned organic luminous layer by several mol % so that these coloring matters generate electroluminescence. Because these coloring matters exhibit a high quantum yield of fluorescence, an external quantum yield was also improved. Such a doping for luminescence of a coloring matter is considered to be especially effective in the following cases.

1) In the band model, i.e., in the energy diagram, a HOMO level and a LUMO level of a dopant are found between the HOMO level and the LUMO level of the host material Alq,. This model is somehow applicable to organic cases.

2) The host material has a luminous spectrum which is mostly overlapped with the excitation spectrum of the dopant.

FIG. 7 is a schematic view of a structure of an organic EL device in which a pigment has been doped into an organic luminous layer 105 for multi-coloring. In this organic EL device, because Alq$_3$ has a comparatively low fluorescence quantum yield, a fluorescent pigment having a high fluorescence quantum yield is doped into Alq$_3$ by several percent mols., thus enhancing the device efficiency. Here, the dopant used may be an organic coloring matter or a pigment, for example, coumarin and DCM. Coumarin generates a blue-green light emission, whereas DCM generates an orange light emission. This EL device improves light emission efficiency as well as enables to realize multi-color emission. Even a material which causes concentration quenching can be used.

Recently, study is also made on an organic ED device using polyvinylcarbazole (PVK) as a host material. There is an example that a film was formed by way of dipping or a spin painting of PVK in which tetraphenylbutadiene (TPB), Nile red, and coumarin in solution are dispersed so as to form an electrode, and white luminescence was obtained. This case requires the same conditions as the organic EL device shown in FIG. 7, and should be soluble in a solvent.

A method has been suggested to obtain luminescence from a pigment by dispersing the pigment in polyvinylcarbazole (PVK). FIG. 8 shows a basic structure of the device in this case. The device is composed of a substrate 200, an anode 201 made of ITO, a luminous layer 202 made of PVK in which the pigment has been dispersed, and a cathode 203 made of Mg, Ag, and the like. These components are stacked on one another in this order. In this configuration, there is a single organic layer. It is also possible to provide an electron transporting layer between the luminous layer 202 and the cathode 203 As for the pigments for obtaining luminescence of colors. TPB, Coumarin 6, and Nile Red are used for obtaining blue color, green color, and red color, respectively. It is also possible to use these pigments simultaneously so as to obtain a white luminescence. The film of the organic layer is formed by the wet method such as dipping and spin coating. In the case of a single layer, the film thickness is 100 nm, whereas in the case of two layers, each of the layers is formed to have a thickness of about 50 nm.

The organic EL device has been studied in the direction of a multi-color type. The conventional dopant which has been doped in the organic luminous layer for the multi-color type of the organic EL device was a pigment. Pigments in general have a planar molecular structure and have a strong intermolecular force. Consequently, there is a problem that when a film is formed, a pigment easily agglutinates. For example, if a plenty of pigment is doped in Alq$_3$ and a film is formed, the resultant luminous layer is turbid, lacks in stability, and has a low voltage resistance. That is, when it is used as a device, it is readily destroyed. Moreover, the conventional dopant is a pigment, which has a small molecular weight and a low melting point. Therefore, the resultant organic luminous layer of a formed film has insufficient heat resistance.

SUMMARY OF THE INVENTION

In view of the above-described problems, the present invention provides an organic EL device doping material having a high melting point and a thermal stability, improving stability of a corresponding organic luminous layer when doped; and an organic EL device containing such a doping material in the organic luminous layer.

An organic electroluminescence device doping material includes metal chelate complex composed of ligands having N N'-bissalicylidene-2,3-diaminobenzofuran (SABF) skeleton.

An organic electroluminescence device doping material can be expressed by Chemical Formula 1,

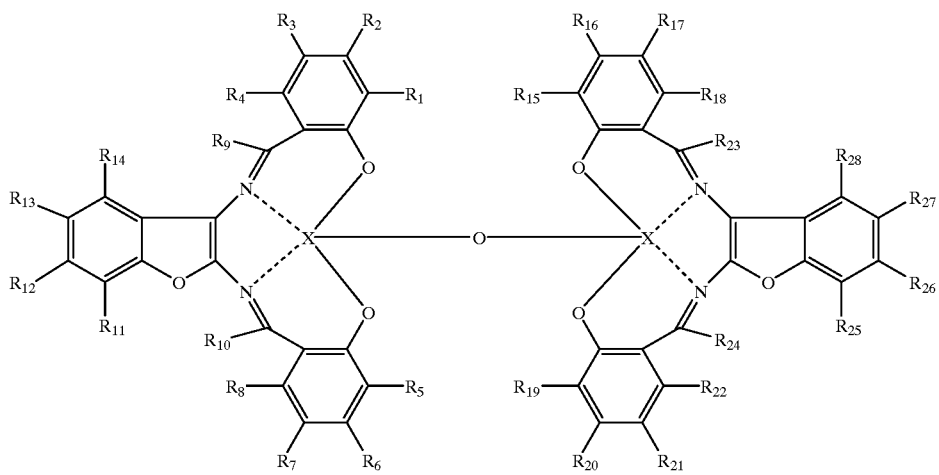

[Chemical Formula 1]

wherein X is a central metal ion, and $R_1$ to $R_2$, independently denote any one of hydrogen group, halogen group, alkyl group, cyano group, nitro group, ester group, amino group, mono- or disubstituted amino group, acylamino group, hydro group, alkoxy group, mercapto group, alkyloxy group, alkylthio group, aryloxy group, arylthio group, siloxy group, acyl group, cycloalkyl group, carbamoyl group, carboxylic group, sulfonate group, imide group, substituted or unsubstituted aliphatic group, substituted or unsubstituted aliphatic cyclic group, substituted or unsubstituted hydrocarbon aromatic group, substituted or unsubstituted heterocyclic aromatic cyclic group, and substituted or unsubstituted heterocyclic group.

An organic electroluminescence device doping material is characterized in that substituted or unsubstituted aliphatic cyclic ring, substituted or unsubstituted carbon cyclic aromatic ring, substituted or unsubstituted heterocyclic aromatic ring, and substituted or unsubstituted hetero cyclic ring are formed with the substituted groups in the neighborhood.

An organic electroluminescence device doping material is further characterized in that the central metal ion X is selected from a group consisting of Mg, Be, Ca, Zn, Al, Ga, In, Sr, Y, Sc, Ti, Zr, Cd, Ba, Sn, V, Co, Ag, Pb, Cu, and Au.

An organic electroluminescence device doping material can be expressed by Chemical Formula 2,

[Chemical Formula 2]

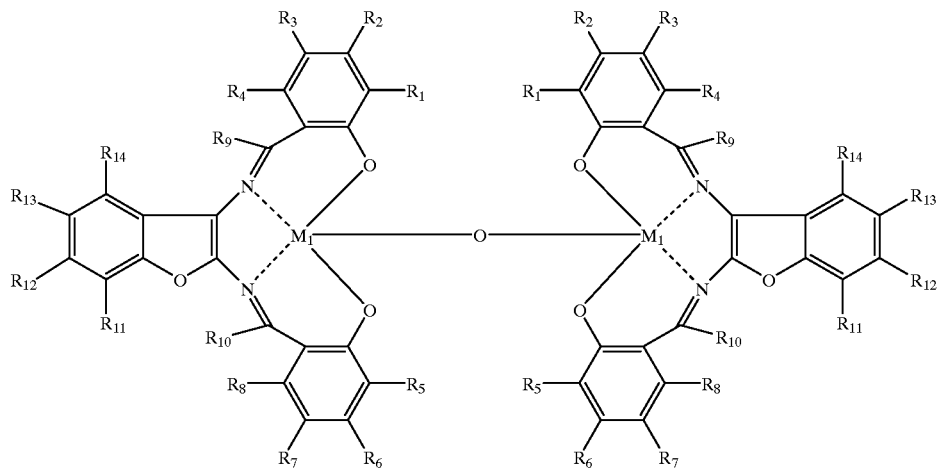

wherein $M_1$ is a central metal ion, and $R_1$ to $R_{14}$ independently denote any one of following groups independently but they are not restricted to only these substituted groups:

hydrogen group, halogen group, cyano group, nitro group, carboxyl group, sulfone group, acylamino group, ester group, mono- or disubstituted amino group, alkoxy group, mercapto group or methyl group, ethyl group, propyl group, butyl group, sec-butyl group, tert-butyl group, pentyl group, hexyl group, heptyl group, octyl group, stearyl group, trichloromethyl group, aminomethyl group, acetoxymethyl group, acetoxyethyl group, acetoxypropyl group, acetoxybutyl group, hydroxymethyl group, hydroxyethyl group, hydroxypropyl group, hydroxybutyl group, vinyl group, styryl group, acetylene group, alkoxy group, mercapto group, alkyloxy group, alkylthio group, aryloxy group, arylthio group, siloxy group, acyl group, cycloalkyl group, substituted group such as carbamoyl group or substituted or unsubstituted acyclic hydrocarbon group, cyclopropyl group, cyclohexyl group, 1,3-cyclohexadienyl group, 2-cyclopentene-1-yl group, 2,4-cyclopentadiene-1-yl group, phenyl group, biphenylenyl group, triphenylenyl group, tetraphenylenyl group, 2-methylphenyl group, 3-nitro phenyl group, 4-methylthiophenyl group, 3,5-dicyanophenyl group, o-,m-, p-tolyl group, xylyl group, o-,m-,p-cumyl group, substituted or unsubstituted monocyclic hydrocarbon group such as mesityl group, pentalenyl group, indenyl group, napthyl group, azulenyl group, heptalenyl group, acenaphtylenyl group, phenalenyl group, fluorenyl group, anthryl group, anthraquinonyl group, 3-methylanthryl group, phenantolyl group, triphenylenyl group, pyrenyl group, crysenyl group, 2-ethyl-1-crysenyl, picenyl group, perilenyl group, 6-chloroperilenyl, pentaphenyl group, pentacenyl group, tetraphenylenyl group, hexaphenyl group, hexacenyl group, rubicenyl group, corronenyl group, trinaphthylenyl group, heptaphenyl group, heptasenyl, substituted or unsubstituted condensed polycyclic hydrocarbon group such as pentalenyl group and oparenyl group, thienyl group, furyl group, pyrrolyl group, imidazolyl group, pyrazolyl group, pyridyl group, pyrazinyl group, pyrimidinyl group, pyridazinyl group, indolyl group, quinolyl group, isoquinolyl group, phthalazinyl group, quinoxalynyl group, quinazolynyl group, carbazolyl group, acrydinyl group, phenadinyl group, furfuryl group, isothiazolyl group, isoquixazolyl group, furazanyl group, phenoquisadinyl group, benzthiazolyl group, benzoxazlyl group, benzoimidazolyl group, 2-methylpyridyl group, substituted or unsubstituted heterocyclic group such as 3-cyanopyridyl group or substituted or unsubstituted aromatic heterocyclic group, hydroxyl group, methoxy group, ethoxy group, propoxy group, butoxy group, sec-butoxy group, tert-butoxy group, pentyloxy group, hexyloxy group, stearyloxy group, phenoxy group, methylthio group, ethylthio group, propylthio group, butylthio group, sec-butylthio group, tert-butylthio group, pentylthio group, hexylthio group, heptylthio group, octylthio group, phenylthio group, amino group, methylamino group, dimethyl amino group, ethyl amino group, diethyl amino group, dipropyl amino group, dibutyl amino group, diphenyl amino group, bis(acetoxymethyl) amino group, bis(acetoxyethyl)amino group, bis(acetoxypropyl)amino group, bis(acetoxybutyl)amino group, dibenzyl amino group, methyl sulfamoyl group, dimethylsufamoyl group, ethyl sulfamoyl group, diethyl sulfamoyl group, propyl sulfamoyl group, butyl sulfamoyl group, pheny sulfamoyl group, diphenyl sulfamoyl group, ethyl carbamoyl group, diethyl carbamoyl group, propyl carbamoyl group, butyl carbamoyl group, phenyl carbamoyl group, methyl carbamoyl amino group, ethyl carbamoyl amino group, propyl carbamoyl amino group, butyl carbamoyl amino group, phenyl carbamnoyl amino group, methoxy carbamoyl amino group, ethoxy carbamoyl amino group, propyl carbamoyl amino group, butoxy carbamoyl amino group, phenoxy carbonyl group, 2-(2-ethoxyethoxy) ethoxy group, 2-(2-ethoxyethoxy) ethylthio group, 2-[2-methoxyethoxy) ethoxy]ethylthio group.

An organic electroluminescence device doping material can be expressed by Chemical Formula 3,

[Chemical Formula 3]

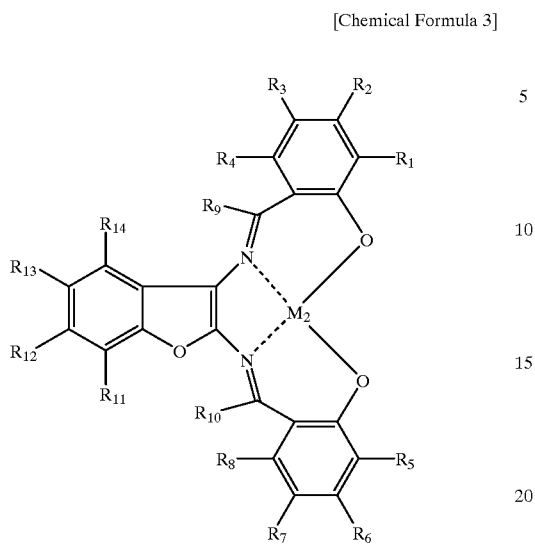

wherein $M_2$ is a center metal, and $R_1$ to $R_{14}$ are any one of following groups independently but they are not restricted to only these substituted groups:

hydrogen group, halogen group, cyano group, nitro group, carboxyl group, sulfone group, acylamino group, ester group, mono- or di-substituted amino group, alkoxy group, mercapto group or methyl group, ethyl group, propyl group, butyl group, secbutyl group, tert-butyl group, pentyl group, hexyl group, heptyl group, octyl group, stearyl group, trichloromethyl group, aminomethyl group, acetoxymethyl group, acetoxyethyl group, acetoxypropyl group, acetoxybutyl group, hydroxymethyl group, hydroxyethyl group, hydroxypropyl group, hydroxybutyl group, stearyl group, vinyl group, styryl group, acetylene group, alkoxy group, mercapto group, alkyloxy group, alkylthio group, aryloxy group, arylthio group, siloxy group, acyl group, cycloalkyl group, substituted group such as carbamoyl group or substituted or unsubstituted acyclic hydrocarbon group, cyclopropyl group, cyclohexyl group, 1,3-cyclohexadienyl group, 2-cyclopentene-1-yl group, 2,4-cyclopentadiene-1-yl group, phenyl group, biphenylenyl group, triphenylenyl group, tetraphenylenyl group, 2-methylphenyl group, 3-nitrophenyl group, 4-methylthiophenyl group, 3,5-dicyanophenyl group, o-,m-,p-tolyl group, xylyl group, o-,m-,p-cumyl group, substituted or unsubstituted monocyclic hydrocarbon group such as mesityl group, pentalenyl group, indenyl group, naphthyl group, azulenyl group, heptylenyl group, acenaphthylenyl group, phenylenyl group, fluorenyl group, anthryl group, anthraquinonyl group, 3-methylanthryl group, phenantolyl group, triphenylenyl group, pyrenyl group, chrysenyl group, 2-ethyl-1-chrysenyl, picenyl group, perilenyl group, 6-chloroperilenyl, pentaphenyl group, pentacenyl group, tetraphenylenyl group, hexaphenyl group, hexacenyl group, rubicenyl group, corronenyl group, trinaphthylenyl group, heptaphenyl group, heptasenyl, substituted or unsubstituted condensed polycyclic hydrocarbon group such as pyranthrenyl group and oparenyl group, thienyl group, furyl group, pyrrolyl group, imidazolyl group, pyrazolyl group, pyridyl group, pyrazinyl group, pyrimidinyl group, pyridazinyl group, indolyl group, quinolyl group, isoquinolyl group, phthalazinyl group, quinoxalynyl group, quinazolynyl group, carbazolyl group, acrydinyl group, phenadinyl group, furfuryl group, isothiazolyl group, isoquinoxazolyl group, furazenyl group, phenoquinadinyl group, benzthiazolyl group, benzoxazolyl group, benzoimidazolyl group, 2-methylpyridyl group, substituted or unsubstituted heterocyclic group such as 3-cyanopyridyl group or substituted or unsubstituted aromatic heterocyclic group, hydroxyl group, methoxy group, ethoxy group, propoxy group, butoxy group, sec-butoxy group, tert-butoxy group, pentoxy group, hexyloxy group, stearyloxy group, phenoxy group, methylthio group, ethylthio group, propylthio group, butylthio group, sec-butylthio group, tert-butylthio group, pentylthio group, hexylthio group, heptylthio group, octylthio group, phenylthio group, amino group, methylamino group, dimethyl amino group, ethyl amino group, diethylamino group, dipropylamino group, dibutylamino group, diphenylamino group, bis(acetoxymethyl)amino group, bis(acetoxyethyl)amino group, bis(acetoxypropyl)amino group, bis(acetoxybutyl) amino group, dibenzylamino group, methylsulfamoyl group, ;dimethylsulfamoyl group, ethylsulfamoyl group, diethylsulfamoyl group, propylsulfamoyl group, butylsulfamoyl group, phenylsulfamoyl group, diphenylsulfamoyl group, ethyl carbamoyl group, diethylcarbamoyl group, propylcarbamoyl group, buty carbamoyl group, phenylcarbamoyl group, methylcarbamoyl amino group, ethylcarbamoyl amino group, propyl carbamoyl amino group, butylcarbamoyl amino group, phenylcarbamoyl amino group, methoxycarbamoyl amino group, ethoxycarbamoylamino group, propylcarbamoylamino group, butoxycarbamoylamino group, phenoxycarbonyl group, 2-(2-ethoxyethoxy)ethoxy group, $^2$-($^2$-ethoxyethoxy)ethylthio group, 2-[2-methoxyethoxy)ethoxy]ethylthio group.

An organic electroluminescence device doping material is characterized in that the central metal ion M2 is selected from a group consisting of Mg, Be, Ca, Zn, Al, Ga In, Sr, Y, Sc, Ti, Zr, Cd, Ba, Sn, V, Co, Ag, Pb, Cu, and Au.

An organic electroluminescence device doping material can be expressed by Chemical Formula 4,

[Chemical Formula 4]

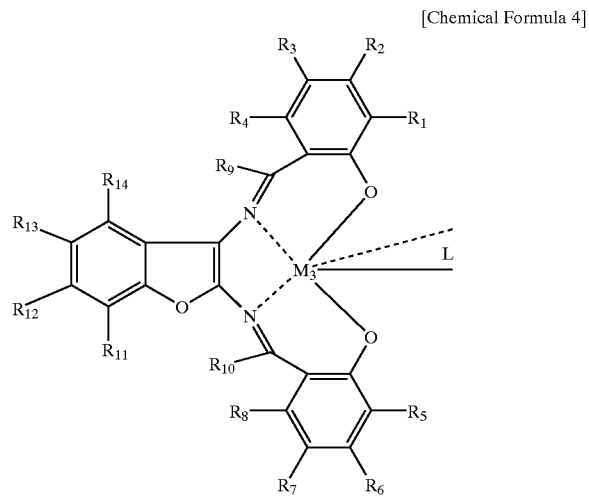

wherein $M_3$ is a central metal ion, L is another ligand, and $R_1$ to $R_{14}$ are any one of following groups independently but they are not restricted to only these substituted groups:

hydrogen group, halogen group, cyano group, nitro group, carboxyl group, sulfone group, acylamino group, ester group, mono- or disubstituted amino group, alkoxy group, mercapto group or methyl group, ethyl group, propyl group, butyl group, secbutyl group, tert-butyl group, pentyl group, hexyl group, heptyl group, octyl group, stearyl group, trichloromethyl group, aminomethyl group, acetoxymethyl group, acetoxyethyl group, acetoxypropyl group, acetoxybutyl group, hydroxymethyl group, hydroxyethyl, group, hydroxypropyl group, hydroxybutyl group, vinyl group, styryl group, acetylene group, alkoxy group, mercapto group, alkyloxy group, alkylthio group, aryloxy group, arylthio group, siloxy group, acyl group, cycloalkyl group, substituted group such as carbamoyl group or substituted or unsubstituted acyclic hydrocarbon group, cyclopropyl group, cyclohexyl group, 1,3-cyclohexadienyl group, 2-cyclopentene-1-yl group 2,4-cyclopentadiene-1-yl group, phenyl group, biphenylenyl group, triphenylenyl group, tetraphenylenyl group, 2-methyl phenyl group, 3-nitrophenyl group, 4-methylthiophenyl group, 3,5dicyanophenyl group, o-, m-, p-tolyl group, xylyl group, o-, m-, p-cumyl group, substituted or unsubstituted monocyclic hydrocarbon group such as mesityl group, pentalenyl group, indenyl group, naphthyl group, azulenyl group, heptalenyl group, acenaphthylenyl group, phenylenyl group, fluorenyl group, anthryl group, anthraquinonyl group, 3-methylanthryl group, phenantolyl group, triphenylenyl group, pyrenyl group, chrysenyl group, 2-ethyl-1-chrysenyl, picenyl group, perilenyl group, 6-chloroperilenyl, pentaphenyl group, pentacenyl group, tetraphenylenyl group, hexaphenyl group, hexacenyl group, rubicenyl group, corronenyl group, trinaphthylenyl group, heptaphenyl group, heptasenyl, substituted or unsubstituted condensed polycyclic hydrocarbon group such as pyranthrenyl group and oparenyl group, thienyl group, furyl group, Pyrrolyl group, imidazolyl group, pyrazolyl group, pyridyl group, pyrazinyl group, pyrimidinyl group, pyridazinyl group.

indolyl group, quinolyl group, isoquinolyl group, phthalazinyl group, quinoxalynyl group, quinazolynyl group, carbazolyl group, acrydinyl group, phenadinyl group, furfuryl group, isothiazolyl group, isoquinazolyl group, furazenyl group, phenoquinadinyl group, benzthiazolyl group, benzoxazlyl group, benzoimidazolyl group, 2-methylpyridyl group, substituted or unsubstituted heterocyclic group such as 3-cyanopyridyl group or substituted or unsubstituted aromatic heterocyclic group, hydroxyl group, methoxy group, ethoxy group, propoxy group, butoxy group, sec-butoxy group, tert-butoxy group, pentoxy group, hexyloxy group, stearyloxy group, phenoxy group, methylthio group, ethylthio group, propylthio group, butylthio group, sec, butylthio group, tert-butylthio group, pentylthio group, hexylthio group, heptylthio group, octylthio group, phenylthio group, amino group, methylamino group, dimethylamino group, ethylamino group, diethylamino group, dipropy amino group, dibutylamino group, diphenylamino group, bis(acetoxymethyl)amino group, bis(acetoxyethyl)amino group, bis(acetoxypropyl) amino group, bis(acetoxybutyl)amino group, dibenzylamino group, methyl sulfamoyl group, dimethylsufamoyl group, ethyl sulfamoyl group, diethylsulfamoyl group, propylsulfamoyl group, butylsulfamoyl group, phenylsulfamoyl group, diphenylsulfamoyl group, ethylcarbamoyl group, diethylcarbamoyl group, propylcarbamoyl group, butylcarbamoyl group, phenylcarbamoyl group, methyl carbamoyl amino group, ethylcarbamoyl amino group, propylcarbamoyl amino group, butyl carbamoyl amino group, phenylcarbamoyl amino group, methoxycarbamoyl amino group, ethoxycarbamoyl amino group, propylcarbamoyl amino group, butoxycarbamoyl amino group, phenoxycarbonyl group, 2-(2-ethoxyethoxy)ethoxy group, 2-(2-ethoxyethoxy)ethylthio group, 2-[2-methoxyethoxy) ethoxy]ethylthio group. An organic electroluminescence device doping material is characterized in that the central metal ion $M_3$ is selected from the group consisting of Mg, Be, Ca, Zn, Al, Ga, In, Sr, Y, Sc, Ti, Zr, Cd, Ba, Sn, V, Co, Ag, Pb, Cu, and Au.

An organic electroluminescence divice doping material is characterizes in that the ligand L represents any one of a group consisting of phenol, derivative of phenol such as 4-phenylphenol, derivative of quinoline such as 2-methyl-8-quinolinol, 5-chloro 8-quinolinol, and 10-hydroxybenzene [h]quinoline, derivative of oxazole, derivative of oxadiazole, derivative of oxathiazole, derivative of triazole, derivative of coumarin, derivative of quinacridone, derivative of quinaldine, derivative of pyrene, derivative of stilylbenzene, aromatic amine, aliphatic amine, and aliphatic alcohol.

An organic electroluminescence device includes an organic luminous layer sandwiched between a pair of electrodes, at least one of which electrodes is translucent. Electrons and electron holes are implanted into the organic luminous layer so as to cause rejoining for generating excitons, extinction of which produces light emission which is utilized via the translucent electrode. The organic electroluminescence device is characterized in that the organic luminous layer contains the organic electroluminescence device doping material of the invention.

An organic electroluminescence device includes an electron implanted transporting layer, an organic luminous layer, and a hole transporting layer between a pair of electrodes, at least one of which electrodes is translucent. The organic luminous layer is made of a material selected from a group consisting of quinoline derivative, oxazole derivative, oxathiazole derivative, oxadiazole derivative, and triazole derivative; and contains the organic electroluminescence device doping material of the invention.

An organic electroluminescence device includes an electron implanted transporting layer and a hole implanted transporting layer which also functions as an organic luminous layer. These layers are sandwiched between a pair of electrodes, at least one of which is translucent. The hole implanted transporting layer is made of a material selected from a group consisting of triphenylamine derivative, phthalocyanine derivative, pyrazoline derivative, thiophenololigomer, polythiophene, polyparaphenylenevinylene, and polyvinylcarbazole. The organic luminous layer is prepared in such a way that a part of the hole implanted transporting layer which is in contact with the electron implanted transporting layer is doped with the organic electroluminescence device doping material of the invention.

An organic electroluminescence device is further characterized in that the organic electroluminescence device doping material of the invention is contained in the aforementioned organic luminous layer with a concentration of 0.01 to 10% by weight.

DETAILED DESCRIPTION OF THE PREFERRED EMBODIMENTS

Figure 1:
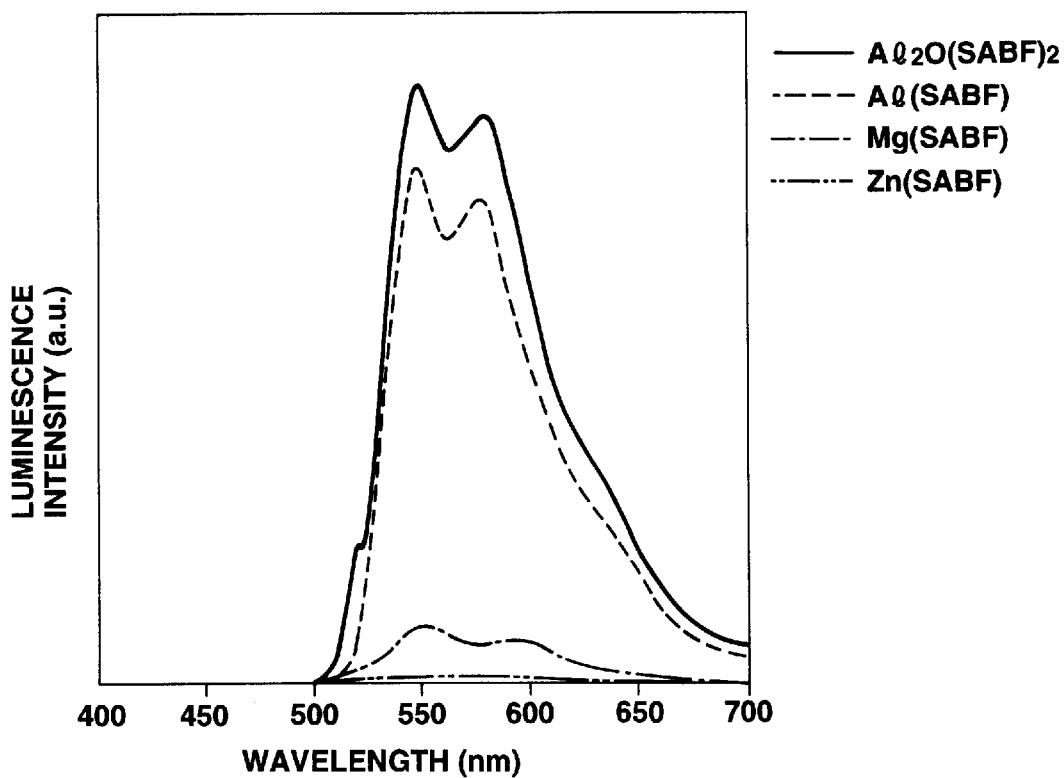
FIG. 1 is a diagram showing a fluorescent spectrum of the SABF complex of an embodiment.

The inventors of the present invention made research on chelate complex as a doping material to be added to the organic luminous layer of the organic EL device. As a result it has been found that a metal chelate complex provided with a ligand having N,N'-Bissalicylidene-2,3-diaminobenzofuran skeleton, so called SABF skeleton, exhibits excellent properties for the aforementioned purpose.

Chemical Formula 1 represents the metal chelate complex according to the present invention. In this formula, the central metal ion X is a metal selected from the group consisting of Mg, Be, Ca, Zn, Al, Ga, In, Sr, Y, Sc, Ti, Zr, Cd, Ba, Sn, V, Co, Ag, Pb, Cu, and Au; and $R_1$ to $R_{28}$ independently denote any one of the following: hydrogen group, halogen group, alkyl group, cyano group, nitro group, ester group, amino group, mono- or disubstituted amino group, acylamino group, hydroxyl group, alkoxy group, mercapto group, alkyloxy group, alkylthio group, aryloxy group, arylthio group, siloxy group, acyl group, cycloalkyl group, carbamoyl group, carboxyl group, sulfonate group, imide group, substituted or unsubstituted aliphatic group, substituted or unsubstituted aliphatic cyclic ring group, substituted or unsubstituted carbocyclic aromatic cyclic group, substituted or unsubstituted heterocyclic aromatic ring group and substituted or unsubstituted hetero ring group.

Chemical Formula 2 represents a case of Chemical Formula 1 in which two ligands are the same. It should be noted that in this formula, $M_1$, is a central metal ion similar to the central metal ion X; and $R_1$ to $R_{14}$ independently denote any one of following groups:

hydrogen group, halogen group, cyano group, nitro group, carboxyl group, sulfone group, acylamino group, ester group, mono- or disubstituted amino group, alkoxy group, mercapto group or methyl group, ethyl group, propyl group, butyl group, sec-butyl group, tert-butyl group, pentyl group, hexyl group, heptyl group, octyl group, stearyl group, trichloromethyl group, aminomethyl group, acetoxymethyl group, acetoxyethyl group, acetoxypropyl group, acetoxybutyl group, hydroxymethyl group, hydroxyethyl group, hydroxypropyl group, hydroxybutyl group, vinyl group, styryl group, acetylene group, alkoxy group, mercapto group, alkyloxy group, alkylthio group, aryloxy group, arylthio group, siloxy group, acyl group, cycloalkyl group, substituted group such as carbamoyl group or substituted or unsubstituted acyclic hydrocarbon group, cyclopropyl group, cyclohexyl group, 1,3-cyclohexadienyl group, 2-cyclopentene-1-yl group, 2,4-cyclopentadiene-1-yl group, phenyl group, biphenylenyl group, triphenylenyl group, tetraphenylenyl group, 2-methyl phenyl group, 3-nitro phenyl group, 4-methylthiophenyl group, 3,5-dicyanophenyl group, o-,m-,p-tolyl group, xylyl group, o-,m-,p-cumyl group, substituted or unsubstituted monocyclic hydrocarbon group such as mesityl group, pentaphenyl group, indenyl group, naphthyl group, azulenyl group, heptalenyl group, acenaphthylenyl group, phenylenyl group, fluorenyl group, anthryl group, anthraquinonyl group, 3-methylanthryl group, phenantolyl group, triphenylenyl group, pyrenyl group, chrysenyl group, 2-ethyl-l-chrysenyl, picenyl group, perilenyl group, 6-chloroperilenyl, pentaphenyl group, pentacenyl group, tetraphenylenyl group, hexaphenyl group, hexacenyl group, rubicenyl group, corronenyl group, trinaphthylenyl group, heptaphenyl group, heptasenyl, substituted or unsubstituted condensed polycyclic hydrocarbon group such as pyranthrenyl group and oparenyl group, thienyl group, furyl group, pyrrolyl group, imidazolyl group, pyrazolyl group, pyridyl group, pyrazinyl group, pyrimidinyl group, pyridazinyl group, indolyl group, quinolyl group, isoquinolyl group, phthalazinyl group, quinoxalynyl group, quinazolynyl group, carbazolyl group, acrydinyl group, phenadinyl group, furfuryl group, isothiazolyl group, isoquinoxazolyl group, furazenyl group, phenoquinadinyl group, benzthiazolyl group, benzoxazlyl group, benzoimidazolyl group, 2-methylpyridyl group, substituted or unsubstituted heterocyclic group such as 3-cyanopyridyl group or substituted or unsubstituted aromatic hererocyclic group, hydroxyl group, methoxy group, ethoxy group, propoxy group, butoxy group, sec-butoxy group, tert-butoxy group, pentyloxy group, hexyloxy group, stearyloxy group, phenoxy group, methylthio group, ethylthio group, propylthio group, butylthio group, sec-butylthio group, tert-butylthio group, pentylthio group, hexylthio group, heptylthio group, octylthio group, phenylthio group, amino group, methylamino group, dimethyl amino group, ethyl amino group, diethyl amino group, dipropyl amino group, dibutyl amino group, diphenyl amino group, bis(acetoxymethyl)amino group, bis(acetoxyethyl) amino group, bis(acetoxypropyl)amino group, bis (acetoxybutyl)amino group, dibenzylamino group, methylsulfamoyl group, dimethylsufamoyl group, ethyl sulfamoyl group, diethylsulfamoyl group, propylsulfamoyl group, butylsulfamoyl group, phenylsulfamoyl group, diphenylsulfamoyl group, ethylcarbamoyl group, diethylcarbamoyl group, propylcarbamoyl group, butylcarbamoyl group, phenylcarbamoyl group, methyl carbamoyl amino group, ethylcarbamoyl amino group, propylcarbamoyl amino group, butyl carbamoyl amino group, phenylcarbamoyl amino group, methoxycarbamoyl amino group, ethoxycarbamoyl amino group, propylcarbamoyl amino group, butoxycarbamoyl amino group, phenoxy carbonyl group, 2-(2-ethoxyethoxy)ethoxy group, 2-(2-ethoxyethoxy) ethylthio group, 2-[2-methoxyethoxy)ethoxy]ethylthio group.

It should be noted that the substitutional groups are not limited to the above-mentioned.

Table 1 shows examples of material used in Examples 1 to 10. A synthetic method will be explained for each of them.

TABLE 1

| Example No. | $R_1$ to $R_{10}$ | $R_{11}$ to $R_{14}$ | $M_1$ |
|---|---|---|---|
| 1 | H | H | Al |
| 2 | H | $R_{11}$=CH$_3$ | Al |
| 3 | H | $R_{12}$=OCH$_3$ | Al |
| 4 | H | $R_{13}$=Ph | Al |
| 5 | H | $R_{13}$=CN | Al |
| 6 | H | $R_{13}$=Gph | Al |
| 7 | H | $R_{13}$=cyclohex | Al |
| 8 | H | $R_{13}$=F | Al |
| 9 | H | $R_{13}$=NH$_2$ | Al |
| 10 | H | $R_{13}$=thienyl group | Al |

EXAMPLE 1

Example 1 uses an organic electroluminescence doping material $\mu$-oxo (N,N'-bissalicyliden-2,3-benzofuran diaminato)aluminum (III), $Al_2O(SABF)_2$, structure of which is shown in Chemical Formula 5.

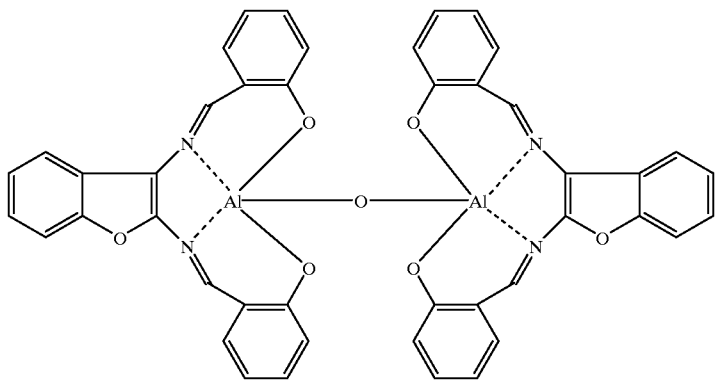

[Chemical Formula 5]

1) Synthetic Method

Take toluene of 200 ml in a beaker of 500 ml and add SABF of 3.56 y (0.01 mol) and aluminum-dinormal buroxy-monoethylacetate of 3.2 g (0.01 mol), and agitate to dissolve under a room temperature. Leave the resultant solution through a night and day. Then, depressurize to distill and remove toluene. Wash the resultant solid component with toluene. After this, dry under vacuum. The yield of this rough product is 50%. Sublimate and refine the obtained rough product for use.

2) Identification of Product

The structure of the product was determined by mass analysis, element analysis, FT-IR, NOR, and thermal analysis.

(1) Mass analysis: m/e 779 (M+)

(2) Element analysis: $C_{44}H_{28}N_4O_7A_{12}$

|  | C | H | N |
|---|---|---|---|
| Calculated value/% | 67.78 | 3.59 | 7.19 |
| Measured value/% | 67.67 | 3.48 | 7.21 |

(3) Thermal Analysis

The obtained powder was subjected to thermal weight differential thermal analysis (TG-DTA). The temperature range was from the room temperature to 500° C. An endoergic peak was observed at 310.4° C. Therefore, the melting point is 310.4° C.

(4) Fluorescent Spectrum of Solution

The obtained powder was dissolved in ethanol so as to obtain an ethanol solution of 0.1 mmol/l. This solution was subjected to fluorescent spectrum analysis. AS shown in FIG. 1, a yellow fluorescent spectrum was observed with its peaks at 582.2 nm and 546.2 nm. The maximum excitation spectrum was 519.2 nm.

(5) Fluorescent Spectrum of Thin Film

The obtained powder was deposited on a glass substrate to form a thin film, which was subjected to fluorescent spectrum analysis. This thin film showed almost no fluorescence. Consequently, this $Al_2O(SABF)_2$ is considered to be not appropriate for composing a luminous layer of the organic ED device.

(6) Excitation Spectrum

Figure 2:
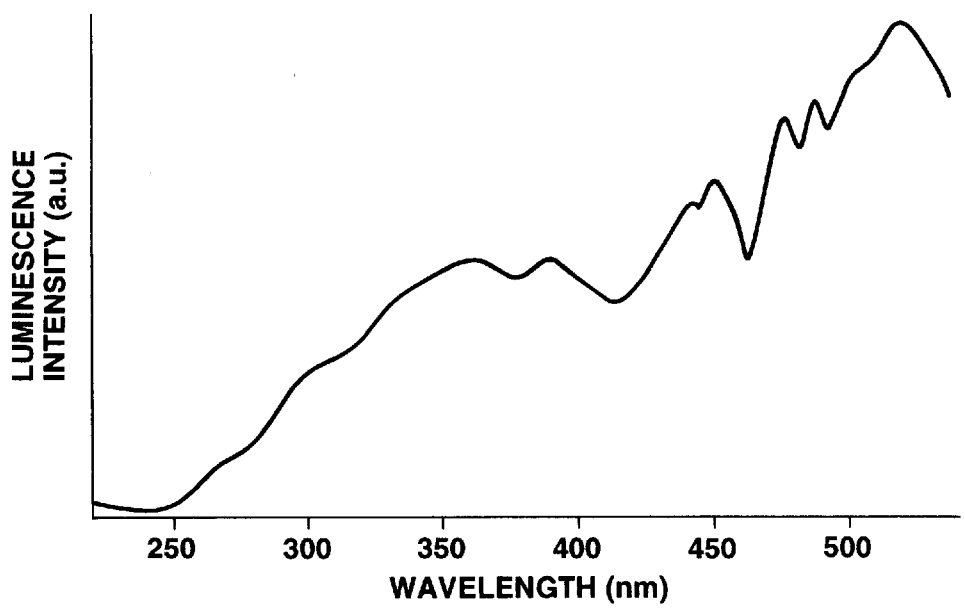
FIG. 2 is a diagram showing an excitation spectrum of the SABF complex of Example 1.

FIG. 2 shows the excitation spectrum of the obtained powder in the 0.1 mmol/l ethanol solution. As shown in this Figure, a peak was observed at 528 nm. Because $Alq_3$ shows an excitation spectrum with a peak In the vicinity of 520 nm, this $Al_2O(SABF)_2$ is considered to be an appropriate dopant for the $Alq_3$.

(7) Ionization Potential

The ionization potential of the obtained powder was analyzed by using cyclic voltammetry. No clear peak could be observed, but the value was about 5.12 (eV).

(8) Band Gap

The obtained powder was deposited on a glass substrate and then its band gap was determined from that absorption. The value of Eg was 2.3 (eV).

(3) Production of Organic EL Device (Sample 1)

Figure 3:
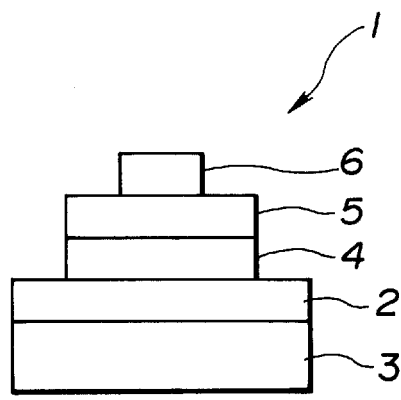
FIG. 3 is a schematic view showing a structure of a first organic EL device of Example 1.
Figure 4:
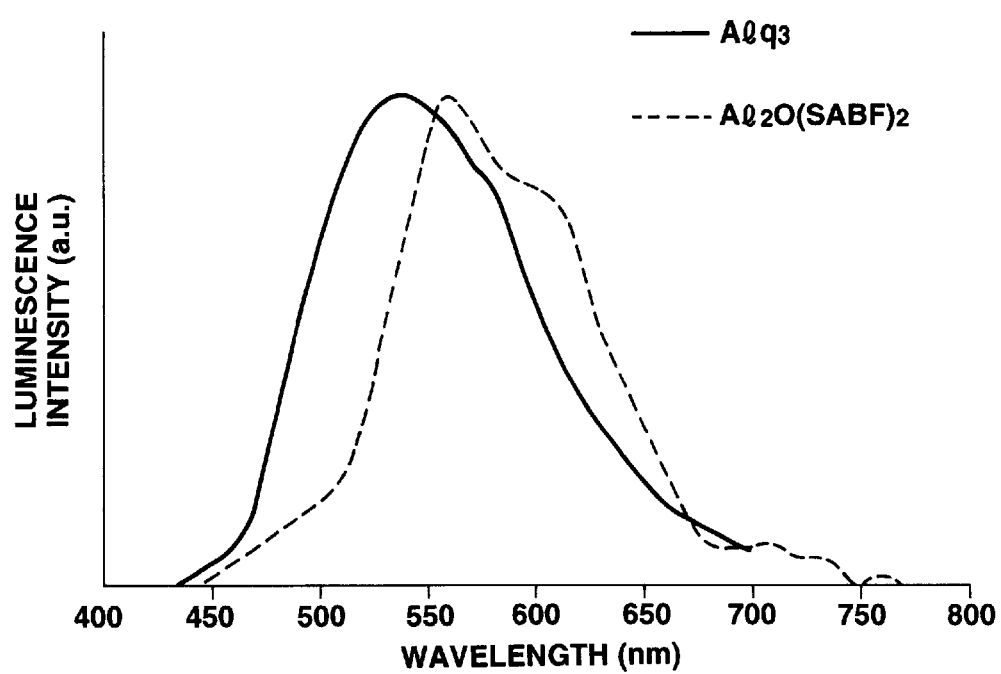
FIG. 4 is a diagram showing electroluscent spectra of the SABF complex and Alq3 in Example 1.

FIG. 3 is a schematic view showing the structure of an organic EL device having a luminous layer doped by $Al_2O(SABF)_2$ synthesized according to this embodiment. This organic EL device 1 is produced as follows. A glass substrate 3 covered with an Indium Tin Oxide (ITO) film as an anode 2 was washed and dried, and then mounted on a vacuum deposition apparatus. After the inside of the apparatus was set to a vacuum of $10^{-5}$ torr, 40 nm of TPD was deposited on the anode 2 (ITO) side of the substrate 3, so as to form a hole implanted transporting layer. Next, $Alq_3$ and $Al_2O(SABF)_2$ were deposited together in the total amount of 50 nm on the side of the electron hole transporting layer 4 (TPD). For this, the $AL_2O(SABF)_2$ was doped by 1 mol. % with respect to $Alq_3$. Temporarily releasing the vacuum, magnesium was further deposited on the luminous layer 5, so as to form a cathode 6. Thus, an organic EL device was obtained. Then, plus DC voltage was applied to the anode 2 (ITO), whereas minus DC voltage was applied to the cathode 6 (magnesium). As a result, a yellow light of 16400 cd/m$^2$ at maximum was emitted with 15 V. FIG. 4 shows the electroluminescence spectrum of this light emission. The external quantum yield was 0.189%.

In the organic EL device according to this embodiment, the cathode may be made of a Mg:Ag alloy or an Al:Li alloy. Moreover, it is also possible to provide a buffer layer made of m-MTDATA or copper-phtalocyanine between the anode and the electron hole implanted transporting layer. Furthermore, as has been described above, in producing an organic EL device, it is preferable to employ a deposition or sputtering method for producing a cathode and anode, whereas a vacuum deposition method be employed for producing a hole implanted transporting layer, luminous layer, and an electron implanted transporting layer.

In order to confirm the effect of the doping of the luminous layer with the $Al_2O(SABF)_2$ according to the present embodiment, a Comparative Example of an organic EL device was prepared without doping the aforementioned material as follows. A glass substrate with ITO was washed, dried, set in the vacuum deposition apparatus, which was set to $10^{-5}$ torr Then, TPD was deposited by 40 nm, and then $Alq_3$ alone was deposited by 50 nm. The vacuum was released temporarily, and magnesium was deposited as an upper electrode, thus obtaining an organic EL device for comparison.

In this Comparative Example of an organic EL device, plus DC voltage was applied to the ITO side, and minus DC voltage was applied to the magnesium side. As a result, a green light was emitted. The external quantum yield was 0.182%. As can be seen when this organic EL device of Comparative Example is compared to that of Example 1, by doping $Al_2O(SABF)_2$ in $Alq_3$, it is possible to increase the quantum yield and increase the wave length of the luminescence spectrum.

The configuration of the organic EL device of Example 1 can be partially modified as follows. Firstly, the electron hole implanted transporting layer may be made of, besides the aforementioned TPD, for example, aromatic class 3 amine, hydrazone derivative, carbazole derivative, triazole derivative, imidazole derivative, and oxadiazole derivative having an amino group.

It is also possible to divide the electron hole implanted transporting layer into an electron hole implanted layer and an electron transporting layer. In this case, the materials Lo be used for preparing these layers can be selected from preferable combinations among the compounds for electron implanted transporting layer. Moreover, it is preferable to stack the compounds in the ascending order of the ionization potential from the anode (ITO) side. Concretely, the electron hole implanted layer is made of triphenylamine derivative (m-MTDATA, etc.) which is called star burst amine, copper phtalocyanin or the like. The electron hole transporting material may be made of TPD which is a dimer of triphenylamine. and the like.

It is also possible to provide an electron implanted transporting layer between the cathode and the luminous layer. The electron implanted transporting layer can be made of an organic metal complex derivative such as alumiquinolinol, oxadiazole derivative, pyridine derivative, pyrimidine derivative quinoline derivative, quinoxaline derivative, diphenylquinon derivative, perilene derivative, and nitroreplaced fluorene derivative.

Instead of the electron implanted transporting layer, it is possible to separately provide an electron implanted layer and an electron transporting layer In this case, these layers can be made by selecting a compound for the electron implanted transporting layer. Moreover, it is preferable to stack the layers in a descending order of the electron affinity from the cathode side.

The luminous layer can be made of tris(8-quinolinonato) aluminum (III), Alq3 and other host materials. The host materials may be, for example, quinoline metal complex such as bis(8-quinolinonato)magnesium (II), bis(8-quinolinonato)zinc (II), tris(8-quinolinonato)indium (III), tris(8-quinolinonato)gallium (III), tris(8-methyl-8-quinolinonato)magnesium (II), 8-quinolinonato lithium (I), tris(5-chloro-8-quinolinonato)aluminum (III), bis(5-chloro-8-quinolinonato)calcium; oxygen bridged chelate complex such as $\mu$-oxo-di[bis(8-quinolinonato)aluminum (III) and $\mu$-oxo-di[bis(2-methyl-8-quinolinonato)aluminum (III), and bis[benzoquinolinonato)berylium [II] Bebq2 and oxodiazole derivative, dimer thereof; triazole derivative and dimer thereof. These materials have been listed only for example, and the material to be used for the luminous layer according to the embodiment of the present invention is not limited to these materials.

When the material according to the present embodiment expressed in Chemical Formula 5 is doped to the host material of the luminous layer, the dopant concentration is preferably 0.01 to 10% by weight.

The luminous layer may contain single: oxygen quencher. The quencher may be nickel complex, rubrene, diphenylisobenzofuran, 3 class amine or the like. The content of the quencher is preferably 10 mold or below in terms of Chemical Formula 1.

Thickness of the luminous layer, thickness of the electron hole implanted transporting layer, and thickness of the electron implanted transporting layer are not restricted to particular values but vary depending on formation method. However, it is preferable that these thicknesses be 5 to 1000 nm, particularly 8 to 200 nm.

For the cathode, it is preferable to use material having a small work function, such as Li, Na, Ma, Al, Ag, In or an alloy containing at least one of these elements.

In order to make the organic EL device emit light from its plane, it is necessary co make at least one of the electrodes transparent or semi-transparent. Concretely, it should be formed of conductive polymer such as ITO, $SnO_2$, Ni, Au, Pt, Pd, polypyrol or the like, and the resistance should be set in a range of 10 to 30 $\Omega/Å†$.

As for the material of the substrate, in order to pick up light emission from the substrate, transparent or semitransparent material such as glass and resin should be used. It is also possible to control luminous color by using a color filter film or dielectric reflective film for the substrate.

(4) Production of an Organic EL Device (Sample 2)

Figure 5:
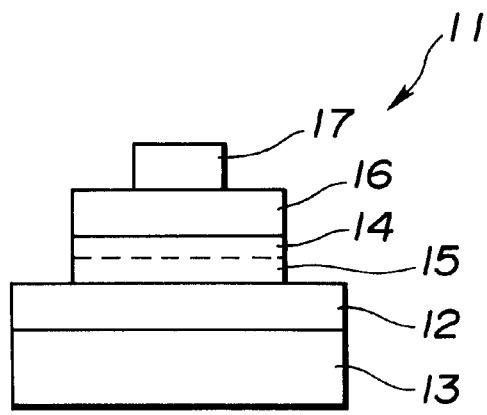
FIG. 5 is a schematic view showing a structure of a second organic EL device of Example 1.
Figure 6:
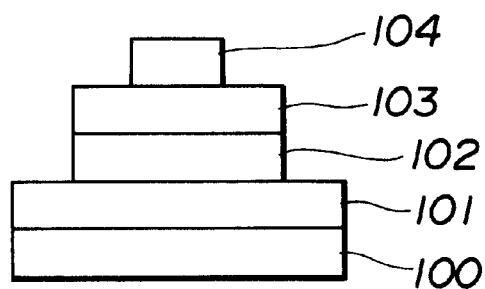
FIG. 6 is a schematic view of a conventional organic EL device.
Figure 7:
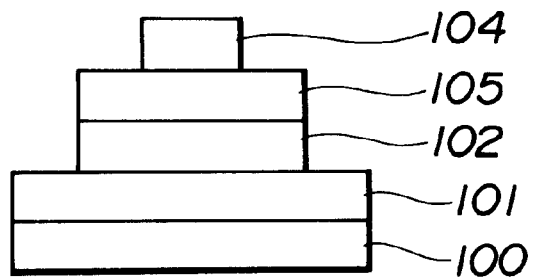
FIG. 7 is a schematic view of another conventional organic EL device.
Figure 8:
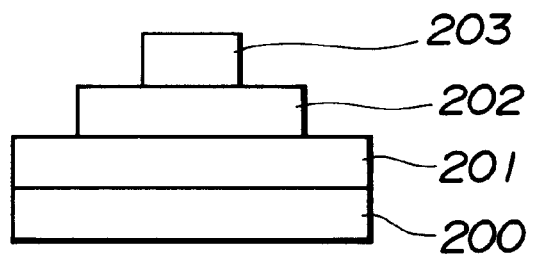
FIG. 8 is a schematic view of still another conventional organic EL device.

FIG. 5 is a schematic view showing configuration of an organic EL device 11 having an electron implanted transporting layer doped by $Al_2O(SABF)_2$ synthesized according to the present embodiment. This organic EL device 11 is provided with an anode 12 made of ITO on a glass substrate 13. The anode 12 is covered by a TPD layer. The upper surface of the TPD layer is doped by $Al_2O(SABF)_2$ according to the present embodiment, and this portion functions as a luminous layer 14. The anode 12 side of the TPD layer which has not been doped by $Al_2O(SABF)_2$ is an electron hole implanted transporting layer 15. An electron implanted transporting layer 16 made of $Alq_3$ is provided on the luminous layer 14. On the electron implanted transporting layer 16, a cathode 17 made of Mg or the like is formed. Such a configuration also enables to obtain effects which can be obtained by the organic EL device 1 illustrated in FIG. 3.

EXAMPLE 2

Example 2 uses an organic electroluminescence doping material N-oxo (N,N'-bissalicyliden-7-methyl-2,3-benzofuran diaminate) aluminum (III), $Al_2O(MSABF)_2$, structure of which is shown in Chemical Formula 6.

[Chemical Formula 6]

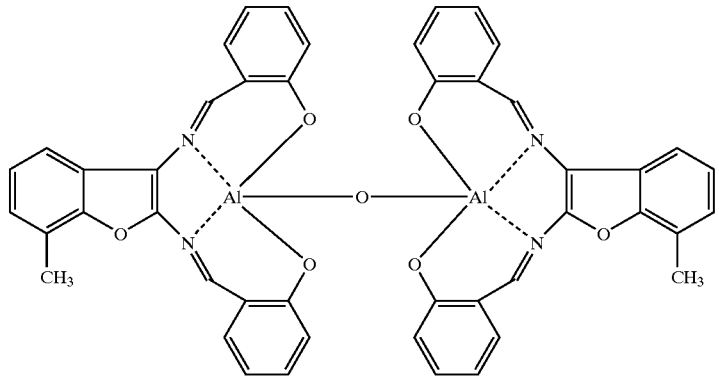

1) Synthetic Method

Take toluene of 200 ml in a beaker of 500 ml and add N,N'-bis salicyliden-2,3-diamino-7-methylbenzofuran of 3.70 g (0.01 mol) and aluminum-dinormal butoxy-monoethylacetate of 3.2 g (0.01 mol), and agitate to dissolve under a room temperature. Leave the resultant solution through a night and day. Then, depressurize to distill and remove toluene. Wash the resultant solid component with toluene. After this, dry under vacuum. The yield of this rough product is 45%. Sublimate and refine the obtained rough product for use.

2) Identification of Product

The structure of the product was determined by mass analysis, element analysis, FT-IR, NMR, and thermal analysis.

(1) Mass analysis: m/e 807 (M+)
(2) Element analysis: $C_{46}H_{32}N_4O_7Al_2$

|  | C | H | N |
|---|---|---|---|
| Calculated value/% | 68.40 | 3.97 | 6.94 |
| Measured value/% | 68.32 | 3.65 | 6.83 |

EXAMPLE 3

Example 3 uses an organic electroluminescence doping material μ-oxo (N,N'-bissalicyliden-6-methoxy-2,3-benzofuran diaminato) aluminum (III), structure of which is shown in Chemical Formula 7.

[Chemical Formula 7]

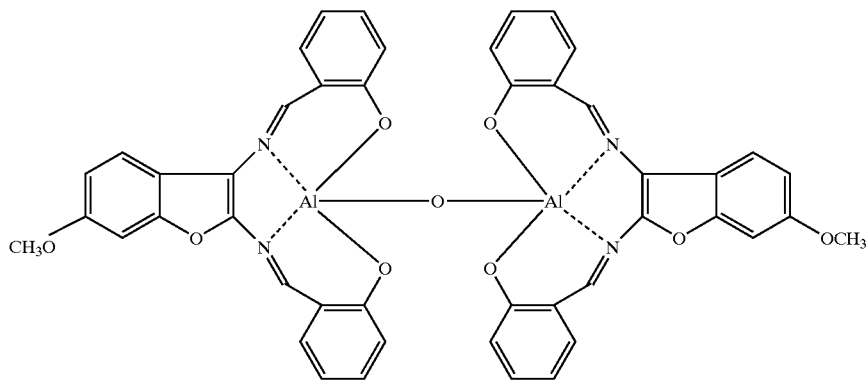

1) Synthetic Method

Take toluene of 200 ml in a beaker of 500 ml and add N,N'-bis salicyliden-2,3-diamino-6-methoxybenzofuran of 3.70 g (0.01 mol) and aluminum-dinormal butoxy-monoethylacetate of 3.2 g (0.01 mol), and agitate to dissolve under a room temperature. Leave the resultant solution through a night and day. Then, depressurize to distill and remove toluene. Wash the resultant solid component with toluene. After this, dry under vacuum. The yield of this rough product is 45%. Sublimate and refine the obtained rough product for use.

2) Identification of Product

The structure of the product was determined by mass analysis, element analysis, FT-IR, NOR, and thermal analysis.

(1) Mass analysis: m/e 839 (M+)

(2) Element analysis: $C_{46}H_{32}N_4O_9Al_2$

|  | C | H | N |
|---|---|---|---|
| Calculated value/% | 65.79 | 3.81 | 6.67 |
| Measured value/% | 65.62 | 3.71 | 6.62 |

EXAMPLE 4

Example 4 uses an organic electroluminescence doping material p-oxo (N,N'-bissalicyliden-5-phenyl-2,3-benzofuran diaminate) aluminum (III), structure of which is shown in Chemical Formula 8.

[Chemical Formula 8]

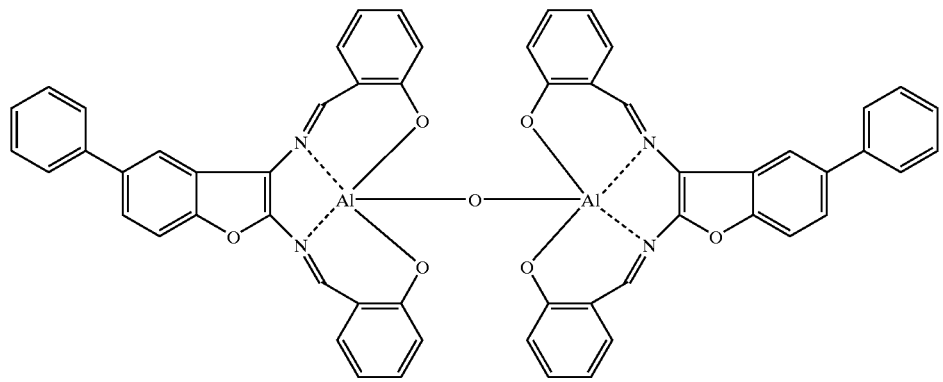

1) Synthetic Method

Take toluene of 200 ml in a beaker of 500 ml and add N,N'-bis salicyliden-2,3-diamino-5-phenylbenzofuran of 4.32 g (0.01 mol) and aluminum-dinormal butoxy-monoethylacetate of 3.2 g (0.01 mol), and agitate to dissolve under a room temperature. Leave the resultant solution through a night and day. Then, depressurize to distill and remove toluene. Wash the resultant solid component with toluene. After this, dry under vacuum. The yield of this rough product is 51%. Sublimate and refine the obtained rough product for use.

2) Identification of Product

The structure of the product was determined by mass analysis, element analysis, FT-IR, HER, and thermal analysis.

(1) Mass analysis: m/e 931 (M+)

(2) Element analysis: $C_{56}H_{36}N_4O_7Al_2$

|  | C | H | N |
|---|---|---|---|
| Calculated value/% | 72.18 | 3.87 | 6.00 |
| Measured value/% | 72.09 | 3.7.5 | 5.92 |

EXAMPLE 5

Example 5 uses an organic electroluminescence doping material μ-oxo (N,N'-bissalicyliden-5-cyano-2,3-benzofuran diaminato) aluminum (III), structure of which is shown in Chemical Formula 9.

[Chemical Formula 9]

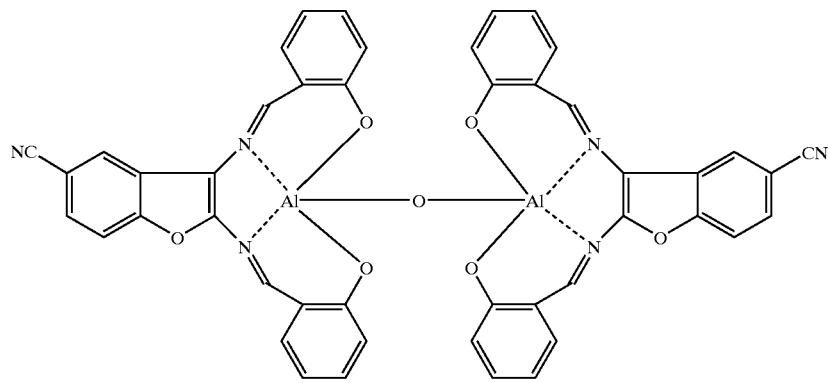

1) Synthetic Method

Take toluene of 200 ml in a beaker of 500 ml and add N,N'-bis salicyliden-2,3-diamino-5-cyanobenzofuran of 3.81 g (0.01 mol) and aluminum-dinormal butoxy-monoethylacetate of 3.2 g (0.01 mol), and agitate to dissolve under a room temperature. Leave the resultant solution through a night and day. Then, depressurize to distill and remove toluene. Wash the resultant solid component with toluene. After this, dry under vacuum. The yield of this rough product is 56%. Sublimate and refine the obtained rough product for use.

2) Identification of Product

The structure of the product was determined by mass analysis, elemental analysis, FT-IR, NMR, and thermal analysis.

(1) Mass analysis: m/e 829 (M+)

(2) Elemental analysis: $C_{44}H_{28}N_4O_7Al_2$

|  | C | H | N |
|---|---|---|---|
| Calculated value/% | 66.59 | 3.14 | 10.10 |
| Measured value/% | 66.51 | 3.08 | 9.91 |

EXAMPLE 6

Example 6 uses an organic electroluminescence doping material μ-oxo (N,N'-bissalicyliden-5-phenoxy-2,3-benzofuran diaminato) aluminum (III), structure of which is shown in Chemical Formula 10.

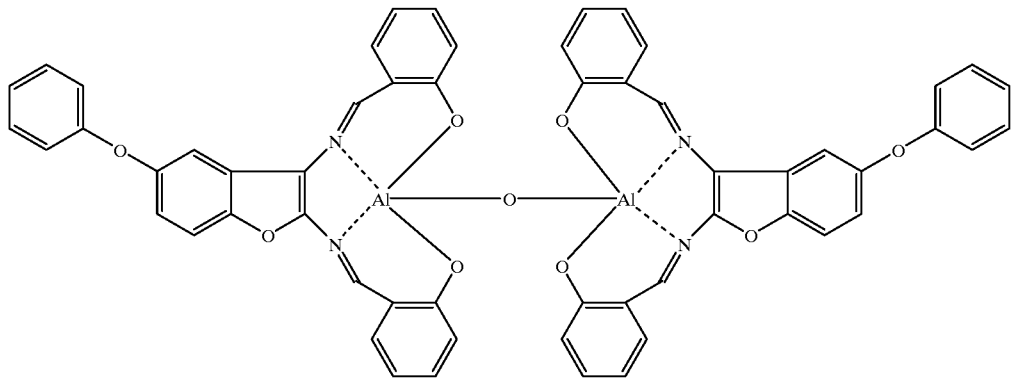

1) Synthetic Method

Take toluene of 200 ml in a beaker of 500 ml and add N,N'-bis salicyliden-2,3-diamino-5-phenoxybenzofuran of 4.48 g (0.01 mol) and aluminum-dinormal butoxy-monoethylacetate of 3.2 g (0.01 mol), and agitate to dissolve under a room temperature. Leave the resultant solution through a night and day. Then, depressurize to distill and remove toluene. Wash the resultant solid component with toluene. After this, dry under vacuum. The yield of this rough product is 52%. Sublimate and refine the obtained rough product for use.

2) Identification of Product

The structure of the product was determined by mass analysis, elemental analysis, FT-IR, NMR, and thermal analysis.

(1) Mass analysis: m/e 963 (M+)

(2) Elemental analysis: $C_{56}H_{38}N_4O_9Al_2$

|  | C | H | N |
| --- | --- | --- | --- |
| Calculated value/% | 69.78 | 3.87 | 5.82 |
| Measured value/% | 69.65 | 3.75 | 5.72 |

EXAMPLE 7

Example 7 uses an organic electroluminescence doping material μ-oxo (N,N'-bissalicyliden-5-cyclohexyl-2,3-benzofuran diaminate) aluminum (III), structure of which is shown in Chemical Formula 11.

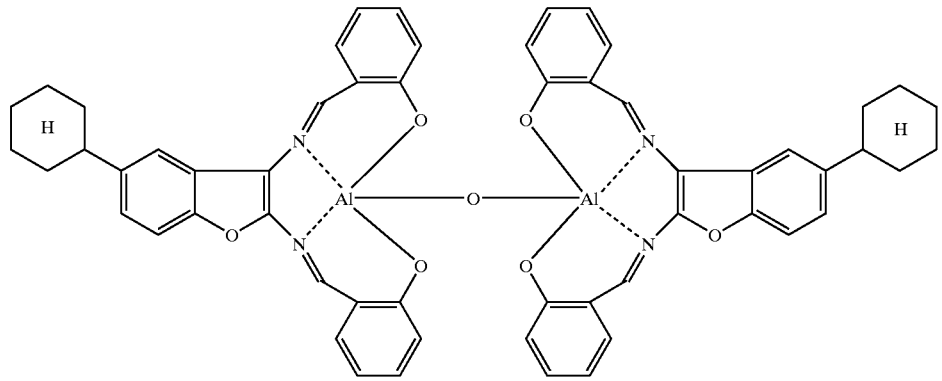

1) Synthetic Method

Take toluene of 200 ml in a beaker of 500 ml and add N,N'-bis salicyliden-2,3-diamino-5-cyclohexylbenzofuran of 4.38 g (0.01 mol) and aluminum-dinormal butoxy-monoethylacetate of 3.2 g (0.01 mol), and agitate to dissolve under a room temperature. Leave the resultant solution through a night and day. Then, depressurize to distill and remove toluene. Wash the resultant solid component with toluene. After this, dry under vacuum. The yield of this rough product is 51%. Sublimate and refine i the obtained rough product for use.

2) Identification of Product

The structure of the product was determined by mass analysis, elemental analysis, FT-IR, NOR, and thermal analysis.

(1) Mass analysis: m/e 943 (M+)
(2) Elemental analysis: $C_{56}H_{48}N_4O_7Al_2$

|  | C | H | N |
|---|---|---|---|
| Calculated value/% | 71.26 | 5.09 | 5.94 |
| Measured value/% | 71.18 | 5.01 | 5.89 |

EXAMPLE 8

Example 8 uses an organic electroluminescence doping material μ-oxo(N,N'-bissalicyliden-5-fluoro-2,3-benzofuran diaminato) aluminum (III), structure of which is shown in Chemical Formula 12.

[Chemical Formula 12]

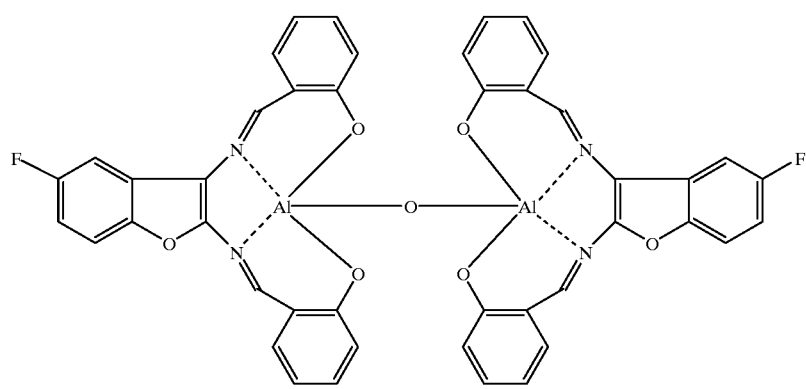

1) Synthetic Method

Take toluene of 200 ml in a beaker of 500 ml and add N,N'-bis salicyliden-2,3-diamino-5-fluorobenzofuran of 3.74 g (0.01 mol) and aluminum-dinormal butoxy-monoethylacetate of 3.2 g (0.01 mol), and agitate to dissolve under a room temperature. Leave the resultant solution through a night and day. Then, repressurize to distill and remove toluene. Wash the resultant solid component with toluene. After this, dry under vacuum. The yield of this rough product is 51%. Sublimate and refine the obtained rough product for use.

2) Identification of Product

The structure of the product was determined by mass analysis, elemental analysis, FT-IR, NMR, and thermal analysis.

(1) Mass analysis: m/e 815 (M+)
(2) Elemental analysis: $C_{44}H_{26}N_4O_7Al_2F_2$

|  | C | H | N |
|---|---|---|---|
| Calculated value/% | 64.79 | 3.19 | 5.87 |
| Measured value/% | 64.71 | 3.12 | 6.82 |

EXAMPLE 9

Example 9 uses an organic electroluminescence doping material μ-oxo(N,N'-bissalicyliden-5-amino-2,3-benzofuranidominate) aluminum (III), structure of which is shown in Chemical Formula 13.

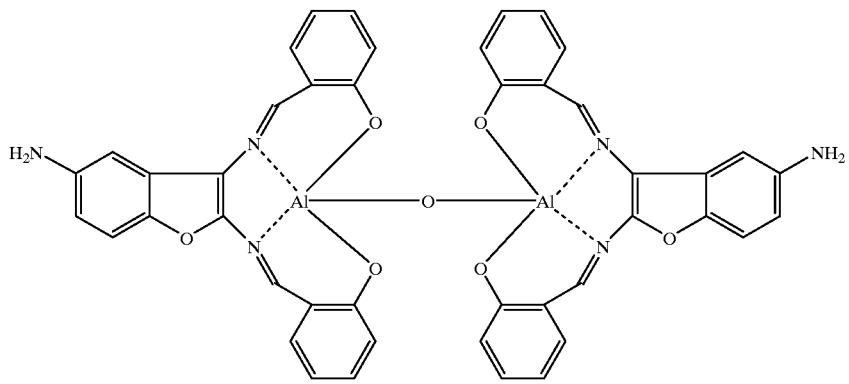

[Chemical Formula 13]

1) Synthetic Method

Take toluene of 200 ml in a beaker of 500 ml and add N,N'-bis salicyliden-2,3,5-triaminobenzofuran of 3.71 g (0.01 mol) and aluminum-dinormal butoxy-monoethylacetate of 3.2 g (0.01 mol), and agitate to dissolve under a room temperature. Leave the resultant solution through a night and day. Then, depressurize to distill and remove toluene. Wash the resultant solid component with toluene. After this, dry under vacuum. The yield of this rough product is 51%. Sublimate and refine the obtained rough product for use.

2) Identification of Product

The structure of the product was determined by mass analysis, elemental analysis, FT-IR, NOR, and thermal analysis.

(1) Mass analysis: m/e 809 (M+)

(2) Elemental analysis: $C_{44}H_{30}N_6O_7Al_2$:

|  | C | H | N |
|---|---|---|---|
| Calculated value/% | 65.27 | 3.71 | 10.38 |
| Measured value/% | 65.21 | 3.68 | 10.31 |

EXAMPLE 10

Example 10 uses an organic electroluminescence doping material μ-oxo(N,N'-bissalicyliden-5-thienyl-2,3-benzofuran dominate) aluminum (III), structure of which is shown in Chemical Formula 14.

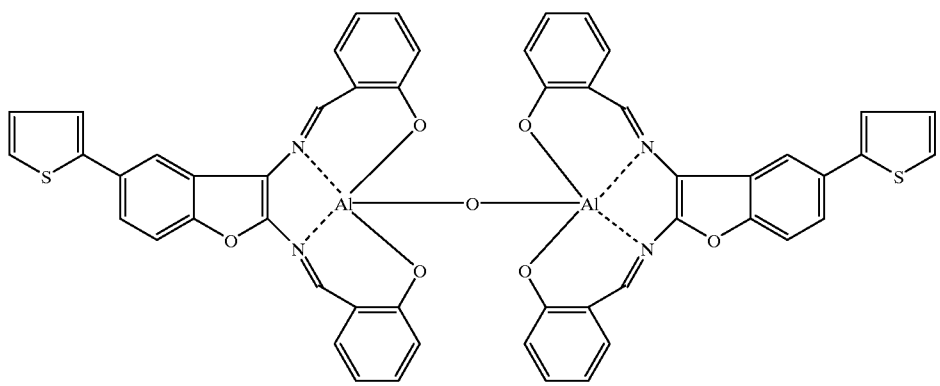

[Chemical Formula 14]

1) Synthetic Method

Take toluene of 200 ml in a beaker of 500 ml and add N,N'-bis salicyliden-2,3-diamino-5-thienylbenzofuran of 4.39 g (0.01 mol) and aluminum-dinormal butoxy-monoethylacetate of 3.2 g (0.01 mol), and agitate to dissolve under a room temperature. Leave the resultant solution through a night and day. Then, depressurize to distill and remove toluene. Wash the resultant solid component with toluene. After this, dry under vacuum. The yield of this rough product is 51%. Sublimate and refine the obtained rough product for use.

2) Identification of Product

The structure of the product was determined by mass analysis, elemental analysis, FT-IR, NMR, and thermal analysis.

(1) Mass analysis: m/e 949 (M+)

(2) Elemental analysis: $C_{52}H_{34}N_4O_7Al_2$

|  | C | H | N |
|---|---|---|---|
| Calculated value/% | 65.75 | 3.58 | 5.9 |
| Measured value/% | 65.71 | 3.52 | 5.83 |

Table 2 shows concrete examples of materials shown in Chemical Formula 3 as Examples 11 to 15. Methods for synthesizing the respective materials will be described below.

TABLE 2

| Example No. | $R_1$ to $R_{14}$ | $M_2$ |
|---|---|---|
| 11 | H | Mg |
| 12 | H | Zn |
| 13 | H | Al |
| 14 | H | Ga |
| 15 | H | Y |

EXAMPLE 11

Example 11 uses an organic electroluminescence doping material Mg (SABF), structure of which is shown in Chemical Formula 15.

[Chemical Formula 15]

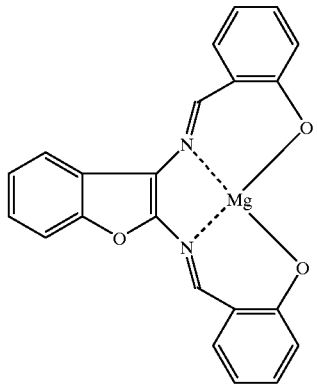

1) Synthetic Method

Take magnesium nitrate of 1.48 g (0.0058 mol) and pure water of 45 ml in a beaker of 100 ml (beaker A), and dissolve it at 60° C. Take SABF 4.1 g (0.0115 mol) and acetone 55 ml in another beaker of 100 ml (beaker B) and dissolve by heat. Add the obtained solution of beaker B into the beaker A. Agitate the solution for two hours. After this add aqueous ammonia to make the solution neutral. Suction-filtrate the resultant precipitate. The yield of rough product obtained is 56%. Recrystallize with acetone and ethanol.

2) Identification of Product

The structure of the product was determined by mass analysis, elemental analysis, FT-IR, NMR, and thermal analysis.

(1) Mass analysis: m/e 379 (M+)

(2) Elemental analysis: $C_{22}H_{14}N_2O_3Mg$

|  | C | H | N |
|---|---|---|---|
| Calculated value/% | 69.72 | 3.70 | 7.39 |
| Measured value/% | 69.68 | 3.52 | 7.21 |

(3) Thermal Analysis

The obtained powder was subjected to thermal weight-differential thermal analysis (TG-DTA). The temperature range was from the room temperature to 600° C. An endoergic peak was observed at 166.3° C. Therefore, the melting point is 166.3° C.

(4) Fluorescent Spectrum of Solution

The 0.1 mmol/l ethanol solution of the obtained powder was subjected to fluorescent spectrum analysis. As a result, a fluorescent spectrum was observed at 561.7 nm and 590.8 nm.

(5) Excitation Spectrum

The excitation spectrum of the obtained material showed a peak at 522.6 nm.

EXAMPLE 12

Example 12 uses an organic electroluminescence doping material Zn(SABF), structure of which is shown in Chemical Formula 16.

[Chemical Formula 16]

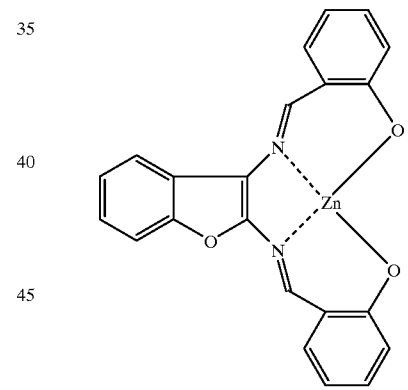

1) Synthetic Method

Take zinc acetate (anhydro) of 1.06 g (0.0058 mol) and pure water of 45 ml in a beaker of 100 ml (beaker A), and dissolve it at about 60° C. Take SABF 4.1 g (0.0116 mol) and acetone 55 ml in another beaker of 100 ml (beaker B) and dissolve by heat. Add the obtained solution of beaker B into the beaker A. Agitate the solution for two hours. After this add aqueous ammonia to make the solution neutral. Suction-filtrate the resultant precipitate. The yield of rough product obtained is 52%. Recrystallize with acetone and ethanol.

2) Identification of Product

The structure of the product was determined by mass analysis, elemental analysis, FT-IR, NMR, and thermal analysis.

(1) Mass analysis: m/e 420 (M+)

(2) Elemental analysis: C₂₂H₁₄N₂O₃Zn

|  | C | H | N |
|---|---|---|---|
| Calculated value/% | 62.89 | 3.34 | 6.67 |
| Measured value/% | 62.81 | 3.21 | 6.56 |

(3) Thermal Analysis

The obtained powder was subjected to thermal weight-differential thermal analysis (TG-DTA), but no clear endoergic peak was observed.

(4) Fluorescent Spectrum of Solution

The 0.1 mmol/l ethanol solution of the obtained powder was subjected to fluorescent spectrum analysis. As a result, a fluorescent spectrum was observed with a peak at 569.8 nm.

(5) Excitation Spectrum

The excitation spectrum of the obtained material showed a peak at 528.4 nm.

EXAMPLE 13

Example 13 uses an organic electroluminescence doping material Al(SABF), structure of which is shown in Chemical Formula 17.

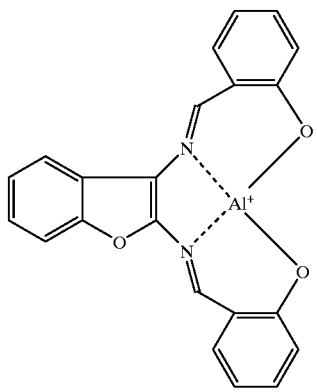

[Chemical Formula 17]

1) Synthetic Method

Take aluminum ammonium sulfate (12-hydro) of 2.62 g (0.0058 mol) and pure water of 45 ml in a beaker of 100 ml (beaker A), and dissolve it at about 60° C. Take SABF 4.1 g (0.0116 mol) and acetone 55 ml in another beaker of 100 ml (beaker B) and dissolve by heat. Add the obtained solution of beaker B into the beaker A. Agitate the solution for two hours. After this add aqueous ammonia to make the solution neutral. Suction-filtrate the resultant precipitate. The yield of rough product obtained is 56%. Recrystallize with acetone and) ethanol.

2) Identification of Product

The structure of the product was determined by mass analysis, elemental analysis, FT-IR, NMR, and thermal analysis.

(1) Mass analysis: m/e 381 (M+)

(2) Elemental analysis: C₂₂H₁₄N₂O₃Al

|  | C | H | N |
|---|---|---|---|
| Calculated value/% | 69.22 | 3.67 | 7.34 |
| Measured value/% | 69.10 | 3.56 | 7.21 |

(3) Thermal Analysis

The obtained powder was subjected to thermal weight-differential thermal analysis (TG-DTA). The endoergic peak was observed at 182.5° C.

(4) Fluorescent Spectrum of Solution

The 0.1 mmol/l ethanol solution of the obtained powder was subjected to fluorescent spectrum analysis. As a result, a fluorescent spectrum was observed with a peak at 546.4 nm and 581.0 nm.

(5) Excitation Spectrum

The excitation spectrum of the obtained material showed a peak at 517.6 nm.

EXAMPLE 14

Example 14 uses an organic electroluminescence doping material Ga(SABF), structure of which is shown in Chemical Formula 18.

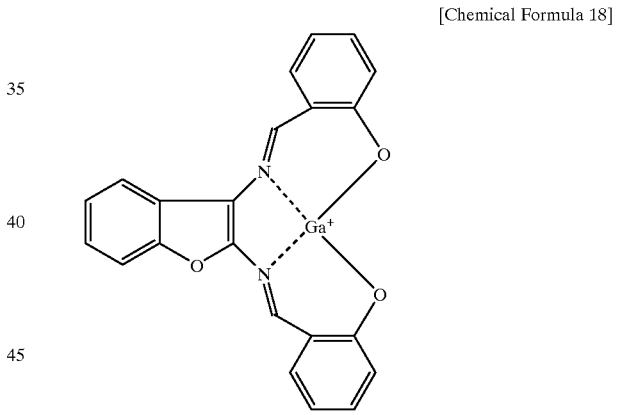

[Chemical Formula 18]

1) Synthetic Method

Take gallium sulfate (12-hydro) of 1.48 g (0.0058 mol) and pure water of 45 ml in a beaker of 100 ml (beaker A), and dissolve it at about 60° C. Take SABF 4.1 g (0.0116 mol) and acetone 55 ml in another beaker of 100 ml (beaker Is) and dissolve by heat. Add the obtained solution of beaker B into the beaker A. Agitate the solution for two hours. After this add aqueous ammonia to make the solution neutral. Suction-filtrate the resultant precipitate. The yield of rough product obtained is 58%. Re-crystallize with acetone and ethanol.

2) Identification of Product

The structure of the product was determined by mass analysis, elemental analysis, FT-IR, NMR, and thermal analysis.

(1) Mass analysis: m/e 424 (M+)

(2) Elemental analysis: $C_{22}H_{14}N_2O_3Ga$

|  | C | H | N |
|---|---|---|---|
| Calculated value/% | 62.26 | 3.30 | 6.60 |
| Measured value/% | 62.23 | 3.24 | 6.56 |

EXAMPLE 15

Example 15 uses an organic electroluminescence doping material Y(SABF), structure of which is shown in Chemical Formula 19.

[Chemical Formula 19]

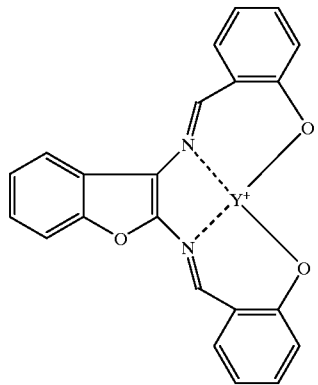

1) Synthetic Method

Take yttrium nitrate 6 hydrate of 2.22 g (0.0058 mol) and pure water of 45 ml in a beaker of 100 ml (beaker A), and dissolve it at 60° C. Take SABF 4.1 g (0.0116 mol) and acetone 55 ml in another beaker of 100 ml (beaker B) and dissolve by heat. Add the obtained solution of beaker s into the beaker A. Agitate the solution for two hours. After this add aqueous ammonia to make the solution neutral. Suction-filtrate the resultant precipitate. The yield of rough product obtained is 61%. Re-crystallize with acetone and ethanol.

2) Identification of Product

The structure of the product was determined by mass analysis, elemental analysis, FT-IR, NMR, and thermal analysis.

(1) Mass analysis: m/e 443 (M+)
(2) Elemental analysis: $C_{22}H_{14}N_2O_3Y$

|  | C | H | N |
|---|---|---|---|
| Calculated value/% | 59.59 | 3.16 | 6.32 |
| Measured value/% | 59.52 | 3.12 | 6.30 |

FIG. 1 is a diagram showing the fluorescent spectrum of Example 1 (expressed by Chemical Formula 5) together with the fluorescent spectra of the complex solutions in Examples 11, 12, and 13 (expressed by Chemical Formulae 15, 16, and 17, respectively). This Figure shows that a complex of SABF with each of metals exhibits a significantly intense fluorescence, and effective as a doping material of the organic EL device.

Table 3 shows concrete examples of the material expressed by Chemical Formula 4 as Examples 16 to 20. These are composite complexes made of SABF with other ligands, and, like Examples 1 to 15, effective as dopants of the luminous layer of the organic EL device. Synthetic method for each of the Examples will be explained below.

TABLE 3

| Example No. | $R_1$ to $R_{14}$ | $M_3$ | L |
|---|---|---|---|
| 16 | H | Al | phenol |
| 17 | H | Al | 4-phenylphenol |
| 18 | H | Al | 2-methyl-8-quinolinol |
| 19 | H | In | 2-methyl-8-quinolinol |
| 20 | H | Ga | 2-methyl-8-quinolinol |

Example 16 uses as an organic electroluminescence device doping material, (N,N'-bissalicylidene-7-tirul-2,3-benzofurandiaminato) (phenolate) aluminum (III), structure of which is expressed in Chemical Formula 20.

[Chemical Formula 20]

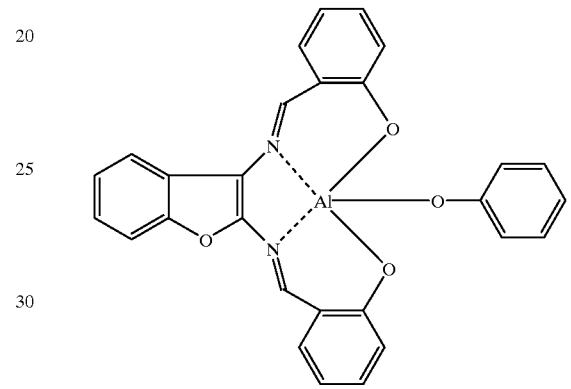

1) Synthetic Method

Re-crystallize N,N'-bissalicylidene-2,3-diaminobenzofuran (SABF) from acetone and ethanol. Filtrate the resultant material and dry it in vacuum at a room temperature. Take recrystallized SABF of 0.178 g (0.0005 mol) and aluminum isopropoxide of 0.204 g (0.001 mol) into a beaker of 100 ml. Further, add anhydrous toluene of 20 ml, and carry out heating and agitation for 30 minutes. Filtrate the resultant solution through a sellaite mat. Transfer the filtrated liquid into a beaker of 100 ml. Further, put the re-crystallized SABF of 0.178 g (0.0005 mol) and phenol of 0.188 g (0.002 mol) into a beaker of 100 ml, and add toluene of 100 ml. Heat and agitate this for 30 minutes. Add the resultant solution to the aforementioned filtrated liquid. Carry out circulation for 4 hours while agitating. After this, cool down to the room temperature. Concentrate the solution by using an evaporator, and filtrate the precipitated solid body. Wash this solid body with toluene and ethanol. Re-crystallize the obtained solid dichloromethane for use.

2) Identification of Product

The structure of the product was determined by mass analysis, elemental analysis, FT-IR, NMR, and thermal analysis.

(1) Mass analysis: m/e 474 (M+)
(2) Elemental analysis: $C_{28}H_{19}N_2O_4Al$

|  | C | H | N |
|---|---|---|---|
| Calculated value/% | 70.89 | 4.01 | 5.91 |
| Measured value/% | 70.82 | 3.98 | 5.86 |

EXAMPLE 17

Example 17 uses as an organic electroluminescence device doping material, (N,N'-bissalicylidene-7-methyl-2,3- benzofurandiaminato) (phenolate) aluminum (III), structure of which is expressed in Chemical Formula 21.

[Chemical Formula 21]

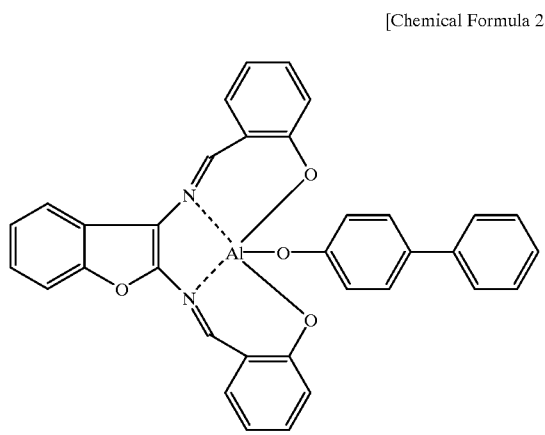

1) Synthetic Method

Re-crystallize N,N'-bissalicylidene-2,3-diaminobenzofuran (SABF) from acetone and ethanol. Filtrate the resultant material and dry it in vacuum at a room temperature. Take recrystallized SABF of 0.178 g (0.0005 mol) and aluminum isopropoxide of 0.204 g (0.001 mol) into a beaker of 100 ml. Further, add anhydrous toluene of 20 ml, and carry out heating and agitation for 30 minutes. Filtrate the resultant solution through a sellaite mat. Transfer the filtrated liquid into a beaker of 100 ml. Further, put the re-crystallized SABF of 0.17 g (0.0005 mol) and 4-phenylphenol of 0.34 g (0.002 mol) into a beaker of 100 ml, and add toluene of 100 ml. Heat and agitate this for 30 minutes. Add the resultant solution to the aforementioned filtrated liquid. Carry out circulation for 4 down to the room temperature. Concentrate the solution by using an evaporator, and filtrate the precipitated solid body. Wash this solid body with toluene and ethanol. Re-crystallize the obtained solid i dichloromethane for use.

2) Identification of Product

The structure of the product was determined by mass analysis, elemental analysis, FT-IR, NOR, and thermal analysis.

(1) Mass analysis: m/e 550 (M+)

(2) Elemental analysis: $C_{34}H_{23}N_2O_4Al$

|  | C | H | N |
|---|---|---|---|
| Calculated value/% | 74.18 | 4.18 | 5.09 |
| Measured value/% | 74.16 | 4.12 | 5.03 |

EXAMPLE 18

Example 18 uses as an organic electroluminescence device doping material, Al(mq) (SABF), structure of which is expressed in Chemical Formula 22.

[Chemical Formula 22]

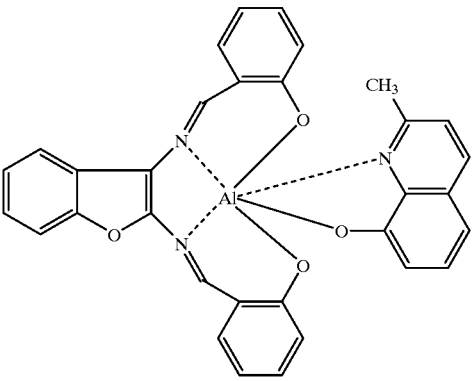

1) Synthetic Method

Re-crystallize 2-methyl-8-quinolyl (mq) from ethanol and water. Filtrate the resultant material and dry it in vacuum at a room temperature. Take re-crystallized 2-methyl-8-quinolyl (ma) of 0.4 g (0.0025 mol) and aluminum isopropoxide of 0.5 g into a beaker of 100 ml. Further, add anhydrous ethanol of 20 ml, and carry out heating and agitation for 30 minutes. Filtrate the resultant solution through a sellaite mat. Transfer the filtrated liquid into a beaker of 100 ml. Further, put the re-crystallized SABF of 0.89 g (0.0025 mol) into a beaker of 100 ml and add ethanol of 100 ml. Heat and agitate this for 30 minutes. Add the resultant solution to the aforementioned filtrated liquid. Carry out circulation for 4 hours while agitating. After this, cool down to the room temperature. Concentrate the solution by using an evaporator, and filtrate the precipitated solid body. Wash this solid body with toluene and ethanol. Re-crystallize the obtained solid dichloromethane for use.

2) Identification of Product

The structure of the product was determined by mass analysis, elemental analysis, FT-IR, NMR, and thermal analysis.

(1) Mass analysis: m/e 540 (M+)

(2) Elemental analysis: $C_{33}H_{22}N_3O_4Al$

|  | C | H | N |
|---|---|---|---|
| Calculated value/% | 73.39 | 4.08 | 7.78 |
| Measured value/% | 73.28 | 4.01 | 7.65 |

(3) Thermal Analysis

The obtained powder was subjected to thermal weight-differential thermal analysis (TG-DTA). The temperature range was from the room temperature to 500° C. As a result, the endoergic peak was observed at 177.3° C.

(4) Fluorescent Spectrum of Solution

The 0.1 l mol/l ethanol solution of the obtained powder was subjected to fluorescent spectrum analysis. As a result, a yellow fluorescent spectrum was observed with a peak at 544.0 nm.

(5) Fluorescent Spectrum of Thin Film

The obtained powder was deposited on a glass substrate so as to form a thin film, which was subjected to flourescent spectrum analysis. Almost no fluorescence was observed from this thin film.

(6) Excitation Spectrum

The excitation spectrum of the obtained material showed a peak at 511.4 nm.

3) Production of an Organic EL Device

A pigment dispersed organic EL device was produced as an organic EL device. PVK and Al (mq) (SABF) (3 mol. % with respect to PVK) were dissolved in dichloroethane. Wash and dry a glass substrate having an ITO film. The ITO side of the glass substrate was spin-coated with the dispersion liquid. This was dried and then set in a vacuum deposition apparatus, which was set to a vacuum of $10^{-5}$ torr. After this TPD of 40 nm was deposited, and then TAZ (triazole derivative) of 20 no, and further $Alq_3$ was deposited. The vacuum was released temporarily. Further, magnesium was deposited as an upper electrode, thus obtaining an organic EL device.

Plus DC voltage was applied to the ITO side of this device and minus DC voltage was applied to the magnesium side of the device. As a result, yellow luminescence of 693 $cdl/m^3$ was obtained at 16 V.

EXAMPLE 19

Example 19 uses as an organic electroluminescence device doping material In(mq) (SABF), structure of which is expressed in Chemical Formula 23.

[Chemical Formula 23]

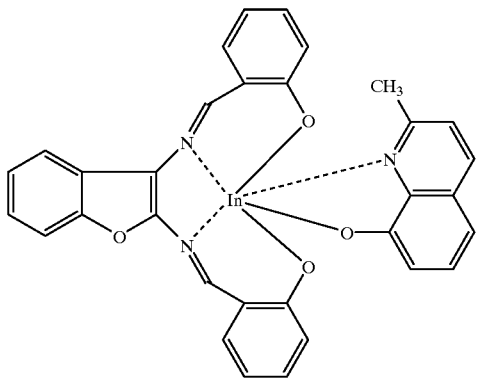

1) Synthetic Method

Re-crystallize 2-methyl-8-quinolyl (mq) from ethanol and water. Filtrate the resultant material and dry it in vacuum at a room temperature. Take re-crystallized 2-methyl-8-quinolil (mq) of 0.4 g (0.0025 mol) and indium sulfate 9-hydrate of 1.7 g (0.0025 mol) into a beaker of 100 ml. Further, add anhydrous ethanol of 20 ml, and carry out heating and agitation for 30 minutes. Filtrate the resultant solution through a sellaite mat. Transfer the filtrated liquid into a beaker of 100 ml. Further, put the re-crystallized SABF of 0.89 g (0.0025 mol) into a beaker of 100 ml and add ethanol of 100 ml Heat and agitate this for 30 minutes. Add the resultant solution to the aforementioned filtrated liquid. Carry out circulation for 4 hours while agitating. After this, cool down to the room temperature. Concentrate the solution by using an evaporator, and filtrate the precipitated solid body. Wash this solid body with toluene and ethanol. Re-crystallize the obtained solid dichloromethane for use.

2) Identification of Product

The structure of the product was determined by mass analysis, elemental analysis, FT-IR, NMR, and thermal analysis.

(1) Mass analysis: m/e 628 (M+)

(2) Elemental analysis: $C_{33}H_{22}N_3O_4In$

|  | C | H | N |
|---|---|---|---|
| Calculated value/% | 63.06 | 3.50 | 6.69 |
| Measured value/% | 63.01 | 3.43 | 7.01 |

EXAMPLE 20

Example 20 uses as an organic electroluminescence device doping material, Ga(mq) (SABF), structure of which is expressed in Chemical Formula 24.

[Chemical Formula 24]

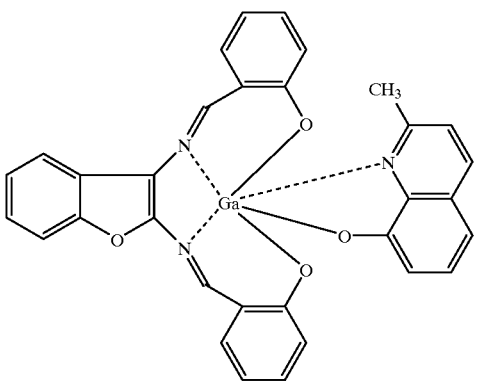

1) Synthetic Method

Re-crystallize 2-methyl-8-quinolyl (mq) from ethanol and water. Filtrate the resultant material and dry it in vacuum at a room temperature. Take re-crystallized 2-methyl-8-quinolyl (mq) of 0.4 g (0.0025 mol) and gallium nitrate 0.64 g (0.0025 mol) into a beaker of 100 ml. Further, add anhydrous ethanol of 20 ml, and carry out heating and agitation for 30 minutes. Filtrate the resultant solution through a sellaite mat. Transfer the filtrated liquid into a beaker of 100 ml. Further, put the re-crystallized SABF of 0.89 g (0.0025 mol) into a beaker of 100 ml and add ethanol of 100 ml. Heat and agitate this for 3–0 minutes. Add the resultant solution to the aforementioned filtrated liquid. Carry out circulation for 4 hours while agitating. After this, cool down to the room temperature. Concentrate the solution by using an evaporator, and filtrate the precipitated solid body. Wash this solid body with toluene and ethanol. Re-crystallize the obtained solid dichloromethane for use.

2) Identification of Product

The structure of the product was determined by mass analysis, elemental analysis, FT-IR, NMR, and thermal analysis.

(1) Mass analysis: m/e 583 (M+)

(2) Elemental analysis: $C_{33}H_{22}N_3O_4Ga$

|  | C | H | N |
|---|---|---|---|
| Calculated value/% | 67.92 | 3.77 | 7.20 |
| Measured value/% | 67.89 | 3.74 | 7.15 |

The chelate complex having SABF as ligands according to the present invention has a high melting point and thermally stable. When a thin film formed as a luminous layer of the organic EL device is doped with this material, the stability of the luminous layer is improved.

When the dopant of the organic EL device is the chelate complex having SABF as ligands according to the present invention, the following effects can be obtained.

1) For example, if $Al_2O(SABF)$, is doped into $Alq_3$, yellow luminescence can be obtained. Thus, multi-color luminescence can be realized in the organic EL device.

2) For example, $Al_2O(SABF)_2$ has an EL spectrum having a wide range of wave length, enabling to obtain green and red color luminescence by using a filter. This realizes a multicolor organic EL device.

3) A combination of luminescence of the SABF complex and a fine pattern filter of enables a fine pattern on a multi-color display.

What is claimed is:

1. An organic electroluminescence device, comprising:
  a luminous layer positioned between a pair of electrodes, at least one of which electrodes is translucent, wherein electrons and holes are implanted into said organic luminous layer so as to cause rejoinder of said electrons and holes which results in the generation of excitons, extinction of which produces light emission which is utilized via said translucent electrode,
  said organic luminous layer being doped with a metal chelate complex whose ligand has a nuclear structure of N,N'-bissalicylidene-2,3-diaminobenzofuran (SABF).

2. The organic electroluminescence device as claimed in claim 1, wherein said metal chelate complex is present as a dopant in the organic luminous layer at a concentration of 0.01 to 10% by weight.

3. An organic electroluminescence device, comprising:
  a luminous layer positioned between a pair of electrodes, at least one of which electrodes is translucent, wherein electrons and holes are implanted into said organic luminous layer so as to cause rejoinder of said electrons and holes which results in the generation of excitons, extinction of which produces light emission which is utilized via said translucent electrode,
  said organic luminous layer being doped with a metal chelate complex of formula (1) as follows:

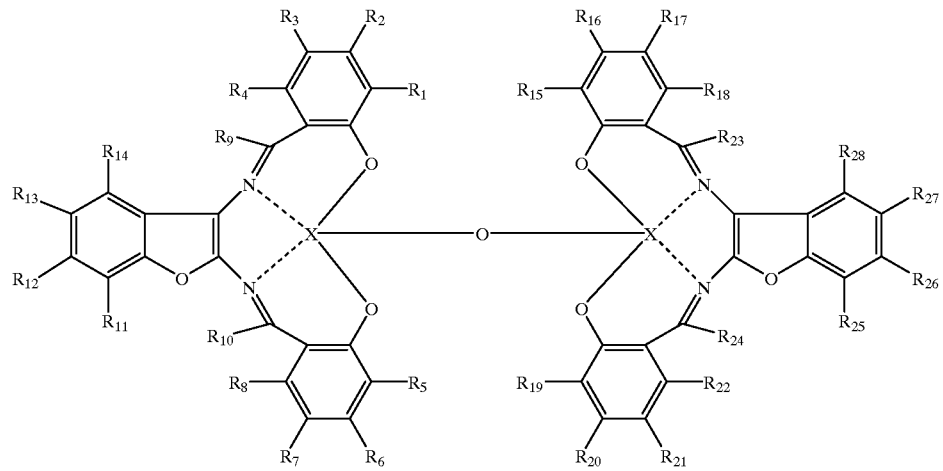

wherein X is a central metal ion, and $R_1$ to $R_{28}$ independently denote any one of: hydrogen, halogen, alkyl, cyano, nitro, ester, amino, mono- or disubstituted amino, acylamino, hydroxyl, alkoxy, mercapto, alkyloxy, alkylthio, aryloxy, arylthio, xyloxy, acyl, cycloalkyl, carbamoyl, a carboxylic acid group, a sulfonate group, an imido group, substituted or an unsubstituted aliphatic group, a substituted or unsubstituted aliphatic cyclic group, a substituted or unsubstituted hydrocarbon aromatic group, a substituted or unsubstituted heterocyclic aromatic group or a substituted or unsubstituted non-aromatic heterocyclic group.

4. The organic electroluminescence device of claim 3, wherein said $R_1$ to $R_{28}$ groups are selected from the group consisting of a substituted or unsubstituted aliphatic cyclic group, a substituted or unsubstituted hydrocarbon aromatic group, a substituted or unsubstituted heterocyclic aromatic group, and a substituted or unsubstituted non-aromatic heterocyclic group.

5. The organic electroluminescence device of claim 3, wherein said central metal ion X is selected from the group consisting of Al, Ga, In, Y, Sc, V, Co and Pb.

6. The organic electroluminescence device as claimed in claim 4, wherein said metal chelate complex is present as a dopant in the organic luminous layer at a concentration of 0.01 to 10% by weight.

7. An organic electroluminescence device, comprising:

an electron transporting layer, an organic luminous layer, and a hole transporting layer positioned between a pair of electrodes, at least one of which electrodes is translucent, said organic luminous layer being made of a material selected from the group consisting of a quinoline compound, an oxazole compound, an oxathiazole compound, an oxadiazole compound, and a triazole compound and doped with a metal chelate complex whose ligand has a nuclear structure of N,N'-bissalicylidene-2,3-diaminobenzofuran (SABF).

8. An organic electroluminescence device, comprising:

an electron transporting layer, an organic luminous layer, and a hole transporting layer positioned between a pair of electrodes, at least one of which electrodes is translucent, said organic luminous layer being made of a material selected from the group consisting of a quinoline compound, an oxazole compound, an oxathiazole compound, an oxadiazole compound, and a triazole compound and doped with a metal chelate complex of formula (1) as follows:

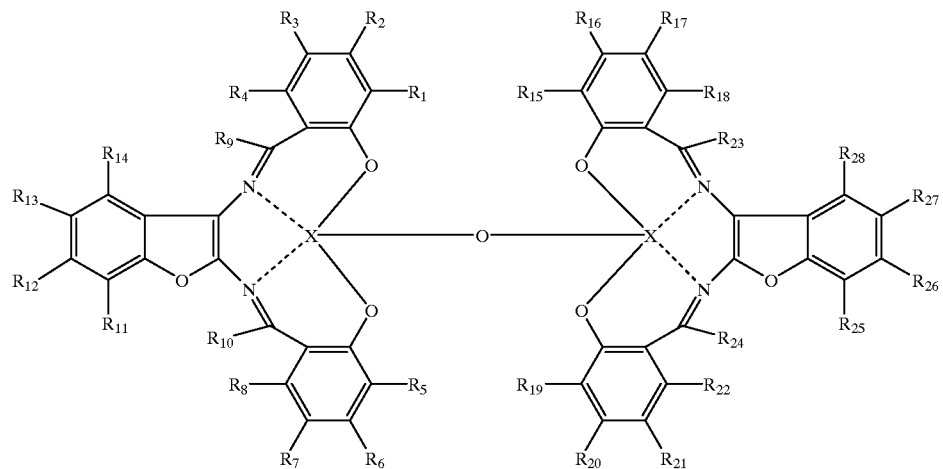

wherein X is a central metal ion, and $R_1$ to $R_{28}$ independently denote any one of: hydrogen, halogen, alkyl, cyano, nitro, ester, amino, mono- or disubstituted amino, acylamino, hydroxyl, alkoxy, mercapto, alkyloxy, alkylthio, aryloxy, arylthio, xyloxy, acyl, cycloalkyl, carbamoyl, a carboxylic acid group, a sulfonate group, an imido group, substituted or an unsubstituted aliphatic group, a substituted or unsubstituted aliphatic cyclic group, a substituted or unsubstituted hydrocarbon aromatic group, a substituted or unsubstituted heterocyclic aromatic group or a substituted or unsubstituted non-aromatic heterocyclic group.

9. The organic electroluminescence device of claim 8, wherein said $R_1$ to $R_{28}$ groups are selected from the group consisting of a substituted or unsubstituted aliphatic cyclic group, a substituted or unsubstituted hydrocarbon aromatic group, a substituted or unsubstituted heterocyclic aromatic group, and a substituted or unsubstituted non-aromatic heterocyclic group.

10. The organic electroluminescence device of claim 9, wherein said central metal ion X is selected from a group consisting of Al, Ga, In, Y, Sc, V, Co and Pb.

11. The organic electroluminescence device as claimed in claim 9, wherein said metal chelate complex is present as a dopant in the organic luminous layer at a concentration of 0.01 to 10% by weight.

12. An organic electroluminescence device, comprising:

an electron transporting layer in contact with an organic, luminous, hole transporting layer positioned between a pair of electrodes, at least one of said electrodes being translucent, wherein said organic, luminous, hole transporting layer is made of a material selected from the group consisting of a triphenylamine compound, a phthalocyanine compound, a pyrazoline compound, a thiophenol oligomer, a polythiophene compound, a polyparaphenylenevinylene, and a polyvinylcarbazole; and a part of said organic, luminous, hole transporting layer being doped with a metal chelate complex whose ligand has a nuclear structure of N,N'-bissalicylidene-2,3-diaminobenzofuran (SABF).

13. The organic electroluminescence device as claimed in claim 12, wherein said metal chelate complex is present as a dopant in the organic, luminous, hole transporting layer at a concentration of 0.01 to 10% by weight.

14. An organic electroluminescence device, comprising:

an electron transporting layer in contact with an organic, luminous hole transporting layer positioned between a pair of electrodes, at least one of said electrodes being translucent, wherein said organic, luminous, hole transporting layer is made of a material selected from the group consisting of a triphenylamine compound, a phthalocyanine compound, a pyrazoline compound, a thiophenol oligomer, a polythiophene compound, a polyparaphenylenevinylene, and a polyvinylcarbazole; and a part of said organic, luminous, hole transporting layer being doped with a metal chelate complex of formula (1) below in which each ligand is a N,N'-bissalicylidene-2,3-diaminobenzofuran (SABF):

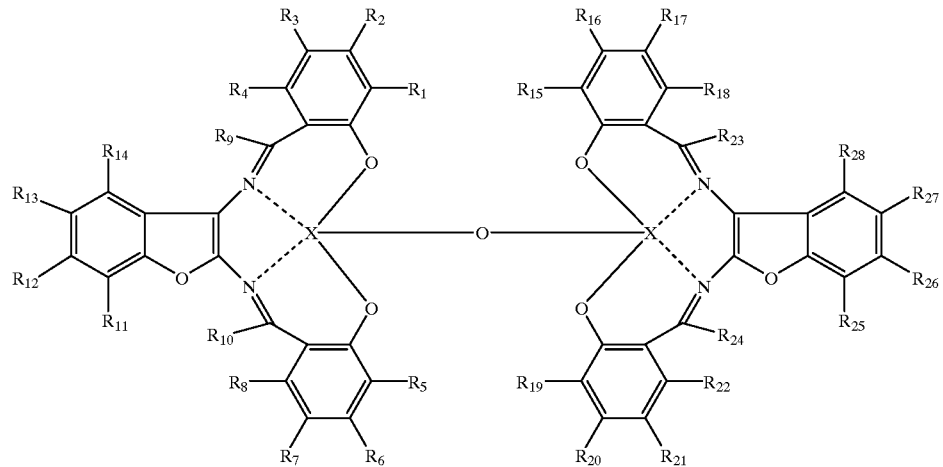

wherein X is a central metal ion, and $R_1$ to $R_{28}$ independently denote any one of: hydrogen, halogen, alkyl, cyano, nitro, ester, amino, mono- or disubstituted amino, acylamino, hydroxyl, alkoxy, mercapto, alkyloxy, alkylthio, aryloxy, arylthio, xyloxy, acyl, cycloalkyl, carbamoyl, a carboxylic acid group, a sulfonate group, an imido group, substituted or an unsubstituted aliphatic group, a substituted or unsubstituted aliphatic cyclic group, a substituted or unsubstituted hydrocarbon aromatic group, a substituted or unsubstituted heterocyclic aromatic group or a substituted or unsubstituted non-aromatic heterocyclic group.

15. The organic electroluminescence device of claim 14, wherein said $R_1$ to $R_{28}$ groups are selected from the group consisting of a substituted or unsubstituted aliphatic cyclic group, a substituted or unsubstituted hydrocarbon aromatic group, a substituted or unsubstituted heterocyclic aromatic group, and a substituted or unsubstituted non-aromatic heterocyclic group.

16. The organic electroluminescence device of claim 14, wherein said central metal ion X is selected from a group consisting of Al, Ga, In, Y, Sc, V, Co and Pb.

17. The organic electroluminescence device as claimed in claim 14, wherein said metal chelate complex is present as a dopant in the organic, luminous, hole transporting layer at a concentration of 0.01 to 10% by weight.

18. An organic electroluminescence device, comprising:

a luminous layer positioned between a pair of electrodes, at least one of which electrodes is translucent, wherein electrons and holes are implanted into said organic luminous layer so as to cause rejoinder of said electrons and holes which results in the generation of excitons, extinction of which produces light emission which is utilized via said translucent electrode, said organic luminous layer being doped with a metal chelate complex of formula (2) below in which each ligand is a N,N'-bissalicylidene-2,3-diaminobenzofuran (SABF):

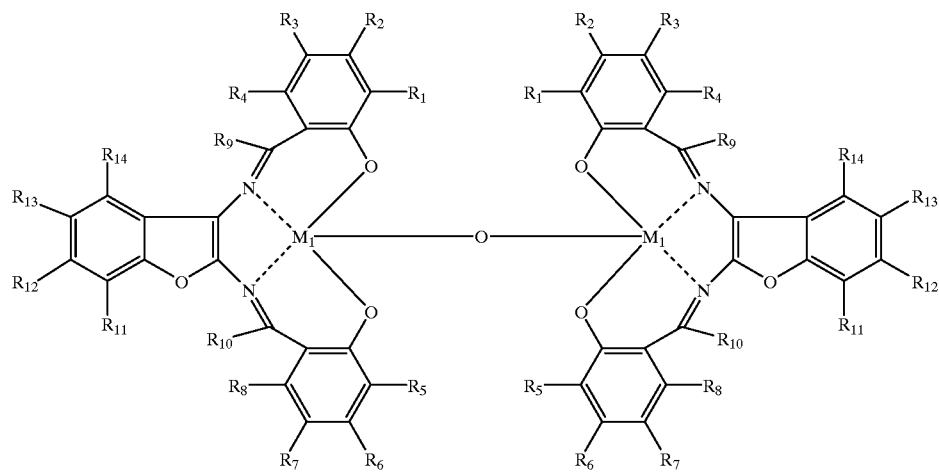

wherein $M_1$ is a central metal ion, and $R_1$ to $R_{14}$ are each independently selected from the group consisting of:
hydrogen, halogen, cyano, nitro, carboxyl, sulfone, acylamino, ester, mono- or disubstituted amino, alkoxy, mercapto, methyl, ethyl, propyl, butyl, sec-butyl, tert-butyl, pentyl, hexyl, heptyl, octyl, stearyl, trichloromethyl, aminomethyl, acetoxymethyl, acetoxyethyl, acetoxypropyl, acetoxybutyl, hydroxymethyl, hydroxyethyl, hydroxypropyl, hydroxybutyl, vinyl, styryl, acetylenyl, alkyloxy, alkylthio, aryloxy, arylthio, siloxy, acyl, cycloalkyl, carbamoyl, a substituted or unsubstituted acyclic hydrocarbon group, cyclopropyl, cyclohexyl, 1,3-cyclohexadienyl, 2-cyclopentene-1-yl, 2,4-cyclopentadiene-1-yl, phenyl, biphenylenyl, triphenylenyl, tetraphenylenyl, 2-methylphenyl, 3-nitrophenyl, 4-methylthiophenyl, 3,5-dicyanophenyl, o-, m- or p-tolyl, xylyl, o-, m- or p-cumyl, a substituted or unsubstituted mono- or polycyclic group selected from the group consisting of mesityl, pentalenyl, indenyl, naphthyl, azulenyl, heptalenyl, acenaphthylenyl, phenylenyl, fluorenyl, anthryl, anthraquinonyl, 3-methylanthryl, phenantholyl, triphenylenyl, pyrenyl, chrysenyl, 2-ethyl-1-chrysenyl, picenyl, perilenyl, 6-chloroperilenyl, pentaphenyl, pentacenyl, tetraphenylenyl, hexaphenyl, hexacenyl, rubicenyl, corronenyl, trinaphthylenyl, heptaphenyl, heptasenyl, pyranthrenyl, oparenyl, thienyl, furyl, pyrrolyl, imidazolyl, pyrazolyl, pyridyl, pyrazinyl, pyrimidinyl, pyridazinyl, indolyl, quinolyl, isoquinolyl, phthalazinyl, quinoxalynyl, quinazolynyl, carbazolyl, acrydinyl, phenadinyl, furfuryl, isothiazolyl, isoquinazolyl, furazenyl, phenoquinadinyl, benzthiazolyl, benzoxazlyl, benzoimidazolyl and 2-methylpyridyl; a substituted or unsubstituted 3-cyanopyridyl group, hydroxyl, methoxy, ethoxy, propoxy, butoxy, sec-butoxy, tert-butoxy, pentyloxy, hexyloxy, stearyloxy, phenoxy, methylthio, ethylthio, propylthio, butylthio, sec-butylthio, tert-butylthio, benzylthio, hexylthio, heptylthio, octylthio, phenylthio, amino, methylamino, dimethylamino, ethylamino, diethylamino, dipropylamino, dibutylamino, diphenylamino, bis(acetoxymethyl)amino, bis(acetoxyethyl)amino, bis(acetoxypropyl)amino, bis(acetoxybutyl)amino, dibenzylamino, methylsulfamoyl, dimethylsulfamoyl, ethyl-sulfamoyl, diethylsulfamoyl, propylsulfamoyl, butylsulfamoyl, phenylsulfamoyl, diphenyl-sulfamoyl, ethylcarbamoyl, diethylcarbamoyl, propylcarbamoyl, butylcarbamoyl, phenyl-carbamoyl, methylcarbamoylamino, ethylcarbamoylamino, propylcarbamoylamino, butyl-carbamoylamino, phenylcarbamoylamino, methoxycarbamoylamino, ethoxycarbamoylamino, propylcarbamoylamino, butoxycarbamoylamino, phenoxycarbonyl, 2-(2-ethoxyethoxy)-ethoxy, 2-(2-ethoxyethoxy)ethylthio and 2-[2-methoxyethoxy)ethoxy]ethylthio.

19. The organic electroluminescence device of claim 18, wherein said central metal ion $M_1$ is selected from the group consisting of Al, Ga, In, Y, Sc, V, Co and Pb.

20. The organic electroluminescence device of claim 18, wherein said metal chelate complex is present as a dopant in the organic luminous layer at a concentration of 0.01 to 10% by weight.

21. An organic electroluminescence device, comprising:
a luminous layer positioned between a pair of electrodes, at least one of which electrodes is translucent, wherein electrons and holes are implanted into said organic luminous layer so as to cause rejoinder of said electrons and holes which results in the generation of excitons, extinction of which produces light emission which is utilized via said translucent electrode,
said organic luminous layer being doped with a metal chelate complex of formula (3) below in which the ligand is a N,N'-bissalicylidene-2,3-diaminobenzofuran (SABF):

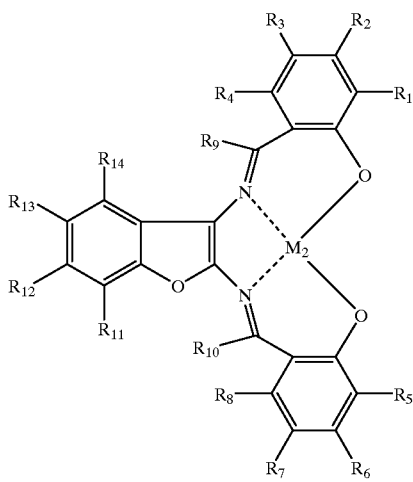

wherein $M_2$ is a central metal ion, and $R_1$ to $R_{14}$ are each independently selected from the group consisting of:

hydrogen, halogen, cyano, nitro, carboxyl, sulfone, acylamino, ester, mono- or di-substituted amino, alkoxy, mercapto, methyl, ethyl, propyl, butyl, sec-butyl, tert-butyl, pentyl, hexyl, heptyl, octyl, stearyl, trichloromethyl, aminomethyl, acetoxymethyl, acetoxyethyl, acetoxypropyl, acetoxybutyl, hydroxymethyl, hydroxyethyl, hydroxypropyl, hydroxybutyl, vinyl, styryl, acetylenyl, alkyloxy, alkylthio, aryloxy, arylthio, siloxy, acyl, cycloalkyl, carbamoyl, a substituted or unsubstituted acyclic hydrocarbon group, cyclopropyl, cyclohexyl, 1,3-cyclohexadienyl, 2-cyclopentene-1-yl, 2,4-cyclopentadiene-1-yl, phenyl, biphenylenyl, triphenylenyl, tetraphenylenyl, 2-methylphenyl, 3-nitrophenyl, 4-methylthiophenyl, 3,5-dicyanophenyl, o-, m- or p-tolyl, xylyl, o-, m- or p-cumyl, a substituted or unsubstituted mono- or polycyclic group selected from the group consisting of mesityl, pentalenyl, indenyl, naphthyl, azulenyl, heptalenyl, acenaphthylenyl, phenylenyl, fluorenyl, anthryl, anthraquinonyl, 3-methylanthryl, phenantholyl, triphenylenyl, pyrenyl, chrysenyl, 2-ethyl-1-chrysenyl, picenyl, perilenyl, 6-chloroperilenyl, pentaphenyl, pentacenyl, tetraphenylenyl, hexaphenyl, hexacenyl, rubicenyl, corronenyl, trinaphthylenyl, heptaphenyl, heptasenyl, pyranthrenyl, oparenyl, thienyl, furyl, pyrrolyl, imidazolyl, pyrazolyl, pyridyl, pyrazinyl, pyrimidinyl, pyridazinyl, indolyl, quinolyl, isoquinolyl, phthalazinyl, quinoxalynyl, quinazolynyl, carbazolyl, acrydinyl, phenadinyl, furfuryl, isothiazolyl, isoquinazolyl, furazenyl, phenoquinadinyl, benzthiazolyl, benzoxazlyl, benzoimidazolyl and 2-methylpyridyl; a substituted or unsubstituted 3-cyanopyridyl group, hydroxyl, methoxy, ethoxy, propoxy, butoxy, sec-butoxy, tert-butoxy, pentyloxy, hexyloxy, stearyloxy, phenoxy, methylthio, ethylthio, propylthio, butylthio, sec-butylthio, tert-butylthio, benzylthio, hexylthio, heptylthio, octylthio, phenylamino, amino, methylamino, dimethylamino, ethylamino, diethylamino, dipropylamino, dibutylamino, diphenylamino, bis(acetoxymethyl)amino, bis(acetoxyethyl)amino, bis(acetoxypropyl)amino, bis(acetoxybutyl)amino, dibenzylamino, methylsulfamoyl, dimethylsulfamoyl, ethyl-sulfamoyl, diethylsulfamoyl, propylsulfamoyl, butylsulfamoyl, phenylsulfamoyl, diphenyl-sulfamoyl, ethylcarbamoyl, diethylcarbamoyl, propylcarbamoyl, butylcarbamoyl, phenyl-carbamoyl, methylcarbamoylamino, ethylcarbamoylamino, propylcarbamoylamino, butylcarbamoylamino, phenylcarbamoylamino, methoxycarbamoylamino, ethoxycarbamoylamino, propylcarbamoylamino, butoxycarbamoylamino, phenoxycarbonyl, 2-(2-ethoxyethoxy)-ethoxy, 2-(2-ethoxyethoxy)ethylthio and 2-[2-methoxyethoxy)ethoxy]ethylthio.

22. The organic electroluminescence device of claim 21, wherein said central metal ion $M_2$ is selected from the group consisting of Mg, Be, Ca and Zn.

23. The organic electroluminescence device as claimed in claim 21, wherein said metal chelate complex is present as a dopant in the organic, luminous layer at a concentration of 0.01 to 10% by weight.

24. An organic electroluminescence device, comprising:
a luminous layer positioned between a pair of electrodes, at least one of which electrodes is translucent, wherein electrons and holes are implanted into said organic luminous layer so as to cause rejoinder of said electrons and holes which results in the generation of excitons, extinction of which produces light emission which is utilized via said translucent electrode,
said organic luminous layer being doped with a metal chelate complex of formula (4) as follows:

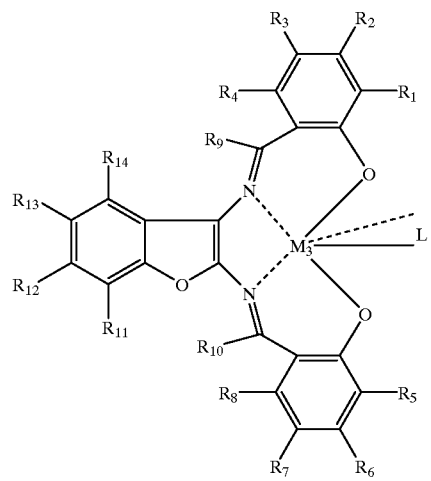

wherein $M_3$ is a central metal ion, L is another ligand, and $R_1$ to $R_{14}$ are each independently selected from the group consisting of:

hydrogen, halogen, cyano, nitro, carboxyl, sulfone, acylamino, ester, mono- or disubstituted amino, alkoxy, mercapto, methyl, ethyl, propyl, butyl, sec-butyl, tert-butyl, pentyl, hexyl, heptyl, octyl, stearyl, trichloromethyl, aminomethyl, acetoxymethyl, acetoxyethyl, acetoxypropyl, acetoxybutyl, hydroxymethyl, hydroxyethyl, hydroxypropyl, hydroxybutyl, vinyl, styryl, acetylenyl, alkyloxy, alkylthio, aryloxy, arylthio, siloxy, acyl, cycloalkyl, carbamoyl, a substituted or unsubstituted acyclic hydrocarbon group, cyclopropyl, cyclohexyl, 1,3-cyclohexadienyl, 2-cyclopentene-1-yl, 2,4-cyclopentadiene-1-yl, phenyl, biphenylenyl, triphenylenyl, tetraphenylenyl, 2-methylphenyl, 3-nitrophenyl, 4-methylthiophenyl, 3,5-dicyanophenyl, o-, m- or p-tolyl, xylyl, o-, m- or p-cumyl, a substituted or unsubstituted mono- or polycyclic group selected from the group consisting of mesityl, pentalenyl, indenyl, naphthyl, azulenyl, heptalenyl, acenaphthylenyl, phenylenyl, fluorenyl, anthryl, anthraquinonyl, 3-methylanthryl, phenantholyl, triphenylenyl, pyrenyl, chrysenyl, 2-ethyl-1-chrysenyl, picenyl, perilenyl, 6-chloroperilenyl, pentaphenyl, pentacenyl, tetraphenylenyl, hexaphenyl, hexacenyl, rubicenyl, corronenyl, trinaphthylenyl, heptaphenyl, heptasenyl, pyranthrenyl, oparenyl, thienyl, furyl, pyrrolyl, imidazolyl, pyrazolyl, pyridyl, pyrazinyl, pyrimidinyl, pyridazinyl, indolyl, quinolyl, isoquinolyl, phthalazinyl, quinoxalynyl, quinazolynyl, carbazolyl, acrydinyl, phenadinyl, furfuryl, isothiazolyl, isoquinazolyl, furazenyl, phenoquinadinyl, benzthiazolyl, benzoxazlyl, benzoimidazolyl and 2-methylpyridyl; a substituted or unsubstituted 3-cyanopyridyl group, hydroxyl, methoxy, ethoxy, propoxy, butoxy, sec-butoxy, tert-butoxy, pentyloxy, hexyloxy, stearyloxy, phenoxy, methylthio, ethylthio, propylthio, butylthio, sec-butylthio, tert-butylthio, benzylthio, hexylthio, heptylthio, octylthio, phenylthio, amino, methylamino, dimethylamino, ethylamino, diethylamino, dipropylamino, dibutylamino, diphenylamino, bis(acetoxymethyl)amino, bis(acetoxyethyl)amino, bis(acetoxypropyl)amino, bis(acetoxybutyl)amino, dibenzylamino, methylsulfamoyl, dimethylsulfamoyl, ethyl-sulfamoyl, diethylsulfamoyl, propylsulfamoyl, butylsulfamoyl, phenylsulfamoyl, diphenyl-sulfamoyl, ethylcarbamoyl, diethylcarbamoyl, propylcarbamoyl, butylcarbamoyl, phenyl-carbamoyl, methylcarbamoylamino, ethylcarbamoylamino, propylcarbamoylamino, butylcarbamoylamino, phenylcarbamoylamino, methoxycarbamoylamino, ethoxycarbamoylamino, propylcarbamoylamino, butoxycarbamoylamino, phenoxycarbonyl, 2-(2-ethoxyethoxy)-ethoxy, 2-(2-ethoxyethoxy)ethylthio and 2-[2-methoxyethoxy)ethoxy]ethylthio.

25. The organic electroluminescence device of claim 24, wherein said central metal ion $M_3$ is selected from a group consisting of Mg, Be, Ca, Zn, Al, Ga, In, Sr, Y, Sc, Ti, Zr, Cd, Ba, Sn, V, Co and Pb.

26. The organic electroluminescence device as claimed in claim 24, wherein said metal chelate complex is present as a dopant in the organic luminous layer at a concentration of 0.01 to 10% by weight.

27. The organic electroluminescence device of claim 24, wherein said ligand L is a member selected from the group consisting of phenol, 4-phenylphenol, 2-methyl-8-quinolinol, 8-quinolinol, 5-chloro-8-quinolinol, 10-hydroxybenzene [h] quinoline, an oxazole, an oxadiazole, an oxathiazole, a triazole, a coumarin, a quinacridone, a quinaldine, a pyrene, a styrylbenzene, an aromatic amine, an aliphatic amine and an aliphatic alcohol.

28. An organic electroluminescence device, comprising:
an electron transporting layer, an organic luminous layer, and a hole transporting layer positioned between a pair of electrodes, at least one of which electrodes is translucent,
said organic luminous layer being made of a material selected from the group consisting of a quinoline compound, an oxazole compound, an oxathiazole compound, an oxadiazole compound, and a triazole compound and doped with a metal chelate complex of formula (2) below in which each ligand is a N,N'-bissalicylidene-2,3-diaminobenzofuran (SABF):

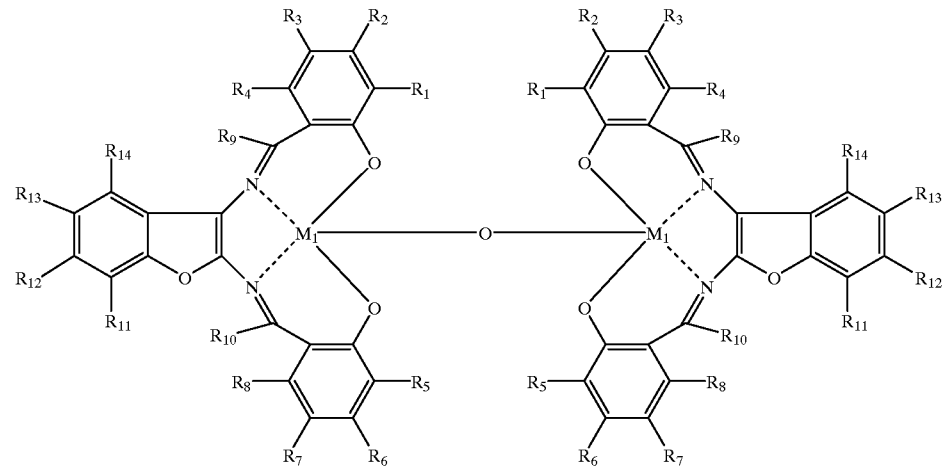

wherein $M_1$ is a central metal ion, and $R_1$ to $R_{14}$ are each independently selected from the group consisting of:
hydrogen, halogen, cyano, nitro, carboxyl, sulfone, acylamino, ester, mono- or disubstituted amino, alkoxy, mercapto, methyl, ethyl, propyl, butyl, set-butyl, tert-butyl, pentyl, hexyl, heptyl, octyl, stearyl, trichloromethyl, aminomethyl, acetoxymethyl, acetoxyethyl, acetoxypropyl, acetoxybutyl, hydroxymethyl, hydroxyethyl, hydroxypropyl, hydroxybutyl, vinyl, styryl, acetylenyl, alkyloxy, alkylthio, aryloxy, arylthio, siloxy, acyl, cycloalkyl, carbamoyl, a substituted or unsubstituted acyclic hydrocarbon group, cyclopropyl, cyclohexyl, 1,3-cyclohexadienyl, 2-cyclopentene-1-yl, 2,4-cyclopentadiene-1-yl, phenyl, biphenylenyl, triphenylenyl, tetraphenylenyl, 2-methylphenyl, 3-nitrophenyl, 4-methylthiophenyl, 3,5-dicyanophenyl, o-, m- or p-tolyl, xylyl, o-, m- or p-cumyl, a substituted or unsubstituted mono- or polycyclic group selected from the group consisting of mesityl, pentalenyl, indenyl, naphthyl, azulenyl, heptalenyl, acenaphthylenyl, phenylenyl, fluorenyl, anthryl, anthraquinonyl, 3-methylanthryl, phenantholyl, triphenylenyl, pyrenyl, chrysenyl, 2-ethyl-1-crysenyl, picenyl, perilenyl, 6-chloroperilenyl, pentaphenyl, pentacenyl, tetraphenylenyl, hexaphenyl, hexacenyl, rubicenyl, corronenyl, trinaphthylenyl, heptaphenyl, heptasenyl, pyranthrenyl, oparenyl, thienyl, furyl, pyrrolyl, imidazolyl, pyrazolyl, pyridyl, pyrazinyl, pyrimidinyl, pyridazinyl, indolyl, quinolyl, isoquinolyl, phthalazinyl, quinoxalynyl, quinazolynyl, carbazolyl, acrydinyl, phenadinyl, furfuryl, isothiazolyl, isoquinazolyl, furazenyl, phenoquinadinyl, benzthiazolyl, benzoxazlyl, benzoimidazolyl and 2-methylpyridyl; a substituted or unsubstituted 3cyanopyridyl group, hydroxyl, methoxy, ethoxy, propoxy, butoxy, sec-butoxy, tert-butoxy, pentyloxy, hexyloxy, stearyloxy, phenoxy, methylthio, ethylthio, propylthio, butylthio, sec-butylthio, tert-butylthio, benzylthio, hexylthio, heptylthio, octylthio, phenylthio, amino, methylamino, dimethylamino, ethylamino, diethylamino, dipropylamino, dibutylamino, diphenylamino, bis(acetoxymethyl)amino, bis(acetoxyethyl)amino, bis(acetoxypropyl)amino, bis(acetoxybutyl)amino, dibenzylamino, methylsulfamoyl, dimethylsulfamoyl, ethyl-sulfamoyl, diethylsulfamoyl, propylsulfamoyl, butylsulfamoyl, phenylsulfamoyl, diphenyl-sulfamoyl, ethylcarbamoyl, diethylcarbamoyl, propylcarbamoyl, butylcarbamoyl, phenyl-carbamoyl, methylcarbamoylamino, ethylcarbamoylamino, propylcarbamoylamino, butyl-carbamoylamino, phenylcarbamoylamino, methoxycarbamoylamino, ethoxycarbamoylamino, propylcarbamoylamino, butoxycarbamoylamino, phenoxycarbonyl, 2-(2-ethoxyethoxy)-ethoxy, 2-(2-ethoxyethoxy)ethylthio and 2-[2-methoxyethoxy)ethoxy]ethylthio.

29. The organic electroluminescence device of claim 28, wherein said central metal ion $M_1$ is selected from a group consisting of Al, Ga, In, Y, Sc, V, Co and Pb.

30. The organic electroluminescence device as claimed in claim 28, wherein said metal chelate complex is present as a dopant in the organic luminous layer at a concentration of 0.01 to 10% by weight.

31. An organic electroluminescence device, comprising:
an electron transporting layer, an organic luminous layer, and a hole transporting layer positioned between a pair of electrodes, at least one of which electrodes is translucent,
said organic luminous layer being made of a material selected from the group consisting of a quinoline compound, an oxazole compound, an oxathiazole compound, an oxadiazole compound, and a triazole compound and doped with a metal chelate complex of formula (3) below in which the ligand is a N,N'-bissalicylidene-2,3-diaminobenzofuran (SABF):

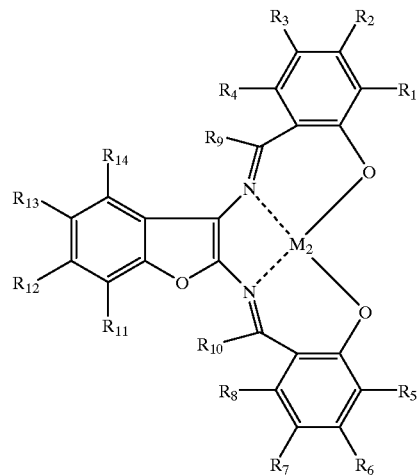

wherein $M_2$ is a central metal ion, and $R_1$ to $R_{14}$ are each independently selected from the group consisting of:
hydrogen, halogen, cyano, nitro, carboxyl, sulfone, acylamino, ester, mono- or di-substituted amino, alkoxy, mercapto, methyl, ethyl, propyl, butyl, sec-butyl, tert-butyl, pentyl, hexyl, heptyl, octyl, stearyl, trichloromethyl, aminomethyl, acetoxymethyl, acetoxyethyl, acetoxypropyl, acetoxybutyl, hydroxymethyl, hydroxyethyl, hydroxypropyl, hydroxybutyl, vinyl, styryl, acetylenyl, alkyloxy, alkylthio, aryloxy, arylthio, siloxy, acyl, cycloalkyl, carbamoyl, a substituted or unsubstituted acyclic hydrocarbon group, cyclopropyl, cyclohexyl, 1,3-cyclohexadienyl, 2-cyclopentene-1-yl, 2,4-cyclopentadiene-1-yl, phenyl, biphenylenyl, triphenylenyl, tetraphenylenyl, 2-methylphenyl, 3-nitrophenyl, 4-methylthiophenyl, 3,5-dicyanophenyl, o-, m- or p-tolyl, xylyl, o-, m- or p-cumyl, a substituted or unsubstituted mono- or polycyclic group selected from the group consisting of mesityl, pentalenyl, indenyl, naphthyl, azulenyl, heptalenyl, acenaphthylenyl, phenylenyl, fluorenyl, anthryl, anthraquinonyl, 3-methylanthryl, phenantholyl, triphenylenyl, pyrenyl, chrysenyl, 2-ethyl-1-chrysenyl, picenyl, perilenyl, 6-chloroperilenyl, pentaphenyl, pentacenyl, tetraphenylenyl, hexaphenyl, hexacenyl, rubicenyl, corronenyl, trinaphthylenyl, heptaphenyl, heptasenyl, pyranthrenyl, oparenyl, thienyl, furyl, pyrrolyl, imidazolyl, pyrazolyl, pyridyl, pyrazinyl, pyrimidinyl, pyridazinyl, indolyl, quinolyl, isoquinolyl, phthalazinyl, quinoxalynyl, quinazolynyl, carbazolyl, acrydinyl, phenadinyl, furfuryl, isothiazolyl, isoquinazolyl, furazenyl, phenoquinadinyl, benzthiazolyl, benzoxazlyl, benzoimidazolyl and 2-methylpyridyl; a substituted or unsubstituted 3-cyanopyridyl group, hydroxyl, methoxy, ethoxy, propoxy, butoxy, sec-butoxy, tert-butoxy, pentyloxy, hexyloxy, stearyloxy, phenoxy, methylthio, ethylthio, propylthio, butylthio, sec-butylthio, tert-butylthio, benzylthio, hexylthio, heptylthio, octylthio, phenylthio, amino, methylamino, dimethylamino, ethylamino, diethylamino, dipropylamino, dibutylamino, diphenylamino, bis(acetoxymethyl)amino, bis(acetoxyethyl)amino, bis(acetoxypropyl)amino, bis(acetoxybutyl)amino, dibenzylamino, methylsulfamoyl, dimethylsulfamoyl, ethyl-sulfamoyl, diethylsulfamoyl, propylsulfamoyl, butylsulfamoyl, phenylsulfamoyl, diphenyl-sulfamoyl, ethylcarbamoyl, diethylcarbamoyl, propylcarbamoyl, butylcarbamoyl, phenyl-carbamoyl, methylcarbamoylamino, ethylcarbamoylamino, propylcarbamoylamino, butylcarbamoylamino, phenylcarbamoylamino, methoxycarbamoylamino, ethoxycarbamoylamino, propylcarbamoylamino, butoxycarbamoylamino, phenoxycarbonyl, 2-(2-ethoxyethoxy)-ethoxy, 2-(2-ethoxyethoxy)ethylthio and 2-[2-methoxyethoxy)ethoxy]ethylthio.

32. The organic electroluminescence device of claim 31, wherein said central metal ion $M_2$ is selected from a group consisting of Mg, Be, Ca and Zn.

33. The organic electroluminescence device as claimed in claim 31, wherein said metal chelate complex is present as a dopant in the organic luminous layer at a concentration of 0.01 to 10% by weight.

34. An organic electroluminescence device, comprising:
an electron transporting layer, an organic luminous layer, and a hole transporting layer positioned between a pair of electrodes, at least one of which electrodes is translucent,
said organic luminous layer being made of a material selected from the group consisting of a quinoline compound, an oxazole compound, an oxathiazole compound, an oxadiazole compound, and a triazole compound and doped with a metal chelate complex of formula (4) as follows:

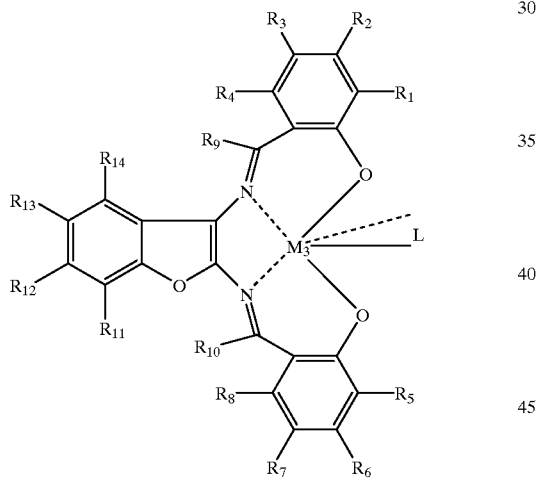

wherein $M_3$ is a central metal ion, L is another ligand, and $R_1$ to $R_{14}$ are each independently selected from the group consisting of:
hydrogen, halogen, cyano, nitro, carboxyl, sulfone, acylamino, ester, mono- or disubstituted amino, alkoxy, mercapto, methyl, ethyl, propyl, butyl, sec-butyl, tert-butyl, pentyl, hexyl, heptyl, octyl, stearyl, trichloromethyl, aminomethyl, acetoxymethyl, acetoxyethyl, acetoxypropyl, acetoxybutyl, hydroxymethyl, hydroxyethyl, hydroxypropyl, hydroxybutyl, vinyl, styryl, acetylenyl, alkyloxy, alkylthio, aryloxy, arylthio, siloxy, acyl, cycloalkyl, carbamoyl, a substituted or unsubstituted acyclic hydrocarbon group, cyclopropyl, cyclohexyl, 1,3-cyclohexadienyl, 2-cyclopentene-1-yl, 2,4-cyclopentadiene-1-yl, phenyl, biphenylenyl, triphenylenyl, tetraphenylenyl, 2-methylphenyl, 3-nitrophenyl, 4-methylthiophenyl, 3,5-dicyanophenyl, o-, m- or p-tolyl, xylyl, o-, m- or p-cumyl, a substituted or unsubstituted mono- or polycyclic group selected from the group consisting of mesityl, pentalenyl, indenyl, naphthyl, azulenyl, heptalenyl, acenaphthylenyl, phenylenyl, fluorenyl, anthryl, anthraquinonyl, 3-methylanthryl, phenanthrolyl, triphenylenyl, pyrenyl, chrysenyl, 2-ethyl-1-chrysenyl, picenyl, perilenyl, 6-chloroperilenyl, pentaphenyl, pentacenyl, tetraphenylenyl, hexaphenyl, hexacenyl, rubicenyl, corronenyl, trinaphthylenyl, heptaphenyl, heptasenyl, pyranthrenyl, oparenyl, thienyl, furyl, pyrrolyl, imidazolyl, pyrazolyl, pyridyl, pyrazinyl, pyrimidinyl, pyridazinyl, indolyl, quinolyl, isoquinolyl, phthalazinyl, quinoxalynyl, quinazolynyl, carbazolyl, acrydinyl, phenadinyl, furfuryl, isothiazolyl, isoquinazolyl, furazenyl, phenoquinadinyl, benzthiazolyl, benzoxazlyl, benzoimidazolyl and 2-methylpyridyl; a substituted or unsubstituted 3-cyanopyridyl group, hydroxyl, methoxy, ethoxy, propoxy, butoxy, sec-butoxy, tert-butoxy, pentyloxy, hexyloxy, stearyloxy, phenoxy, methylthio, ethylthio, propylthio, butylthio, sec-butylthio, tert-butylthio, benzylthio, hexylthio, heptylthio, octylthio, phenylthio, amino, methylamino, dimethylamino, ethylamino, diethylamino, dipropylamino, dibutylamino, diphenylamino, bis(acetoxymethyl)amino, bis(acetoxyethyl)amino, bis(acetoxypropyl)amino, bis(acetoxybutyl)amino, dibenzylamino, methylsulfamoyl, dimethylsulfamoyl, ethyl-sulfamoyl, diethylsulfamoyl, propylsulfamoyl, butylsulfamoyl, phenylsulfamoyl, diphenyl-sulfamoyl, ethylcarbamoyl, diethylcarbamoyl, propylcarbamoyl, butylcarbamoyl, phenyl-carbamoyl, methylcarbamoylamino, ethylcarbamoylamino, propylcarbamoylamino, butylcarbamoylamino, phenylcarbamoylamino, methoxycarbamoylamino, ethoxycarbamoylamino, propylcarbamoylamino, butoxycarbamoylamino, phenoxycarbonyl, 2-(2-ethoxyethoxy)-ethoxy, 2-(2-ethoxyethoxy)ethylthio and 2-[2-methoxyethoxy)ethoxy]ethylthio.

35. The organic electroluminescence device of claim 34, wherein said central metal ion $M_3$ is selected from a group consisting of Mg, Be, Ca, Zn, Al, Ga, In, Sr, Y, Sc, Ti, Zr, Cd, Ba, Sn, V, Co and Pb.

36. The organic electroluminescence device of claim 34, wherein said ligand L is a member selected from the group consisting of phenol, 4-phenylphenol, 2-methyl-8-quinolinol, 8-quinolinol, 5-chloro-8-quinolinol, 10-hydroxybenzene [h] quinoline, an oxazole, an oxadiazole, an oxathiazole, a triazole, a coumarin, a quinacridone, a quinaldine, a pyrene, a styrylbenzene, an aromatic amine, an aliphatic amine and an aliphatic alcohol.

37. The organic electroluminescence device as claimed in claim 34, wherein said metal chelate complex is present as a dopant in the organic luminous layer at a concentration of 00.1 to 10% by weight.

38. An organic electroluminescence device, comprising:
an electron transporting layer in contact with an organic, luminous, hole transporting layer positioned between a pair of electrodes, at least one of said electrodes being translucent, wherein said organic, luminous, hole transporting layer is made of a material selected from the group consisting of a triphenylamine compound, a phthalocyanine compound, a pyrazoline compound, a thiophenol oligomer, a polythiophene compound, a polyparaphenylenevinylene, and a polyvinylcarbazole; and a part of said organic, luminous, hole transporting layer being doped with a metal chelate complex of formula (2) below in which each ligand is a N,N'-bissalicylidene-2,3-diaminobenzofuran (SABF):

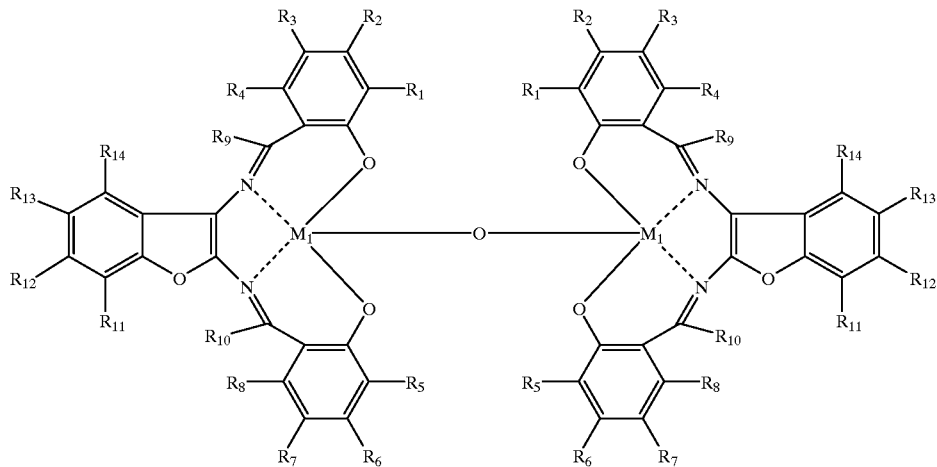

wherein $M_1$ is a central metal ion, and $R_1$ to $R_{14}$ are each independently selected from the group consisting of:

hydrogen, halogen, cyano, nitro, carboxyl, sulfone, acylamino, ester, mono- or disubstituted amino, alkoxy, mercapto, methyl, ethyl, propyl, butyl, sec-butyl, tert-butyl, pentyl, hexyl, heptyl, octyl, stearyl, trichloromethyl, aminomethyl, acetoxymethyl, acetoxyethyl, acetoxypropyl, acetoxybutyl, hydroxymethyl, hydroxyethyl, hydroxypropyl, hydroxybutyl, vinyl, styryl, acetylenyl, alkyloxy, alkylthio, aryloxy, arylthio, siloxy, acyl, cycloalkyl, carbamoyl, a substituted or unsubstituted acyclic hydrocarbon group, cyclopropyl, cyclohexyl, 1,3-cyclohexadienyl, 2-cyclopentene-1-yl, 2,4-cyclopentadiene-1-yl, phenyl, biphenylenyl, triphenylenyl, tetraphenylenyl, 2-methylphenyl, 3-nitrophenyl, 4-methylthiophenyl, 3,5-dicyanophenyl, o-, m- or p-tolyl, xylyl, o-, m- or p-cumyl, a substituted or unsubstituted mono- or polycyclic group selected from the group consisting of mesityl, pentalenyl, indenyl, naphthyl, azulenyl, heptalenyl, acenaphthylenyl, phenylenyl, fluorenyl, anthryl, anthraquinonyl, 3-methylanthryl, phenantholyl, triphenylenyl, pyrenyl, chrysenyl, 2-ethyl-1-chrysenyl, picenyl, perilenyl, 6-chloroperilenyl, pentaphenyl, pentacenyl, tetraphenylenyl, hexaphenyl, hexacenyl, rubicenyl, corronenyl, trinaphthylenyl, heptaphenyl, heptasenyl, pyranthrenyl, oparenyl, thienyl, furyl, pyrrolyl, imidazolyl, pyrazolyl, pyridyl, pyrazinyl, pyrimidinyl, pyridazinyl, indolyl, quinolyl, isoquinolyl, phthalazinyl, quinoxalynyl, quinazolynyl, carbazolyl, acrydinyl, phenadinyl, furfuryl, isothiazolyl, isoquinazolyl, furazenyl, phenoquinadinyl, benzthiazolyl, benzoxazlyl, benzoimidazolyl and 2-methylpyridyl; a substituted or unsubstituted 3-cyanopyridyl group, hydroxyl, methoxy, ethoxy, propoxy, butoxy, sec-butoxy, tert-butoxy, pentyloxy, hexyloxy, stearyloxy, phenoxy, methylthio, ethylthio, propylthio, butylthio, sec-butylthio, tert-butylthio, benzylthio, hexylthio, heptylthio, octylthio, phenylthio, amino, methylamino, dimethylamino, ethylamino, diethylamino, dipropylamino, dibutylamino, diphenylamino, bis(acetoxymethyl)amino, bis(acetoxyethyl)amino, bis(acetoxypropyl)amino, bis(acetoxybutyl)amino, dibenzylamino, methylsulfamoyl, dimethylsulfamoyl, ethyl-sulfamoyl, diethylsulfamoyl, propylsulfamoyl, butylsulfamoyl, phenylsulfamoyl, diphenyl-sulfamoyl, ethylcarbamoyl, diethylcarbamoyl, propylcarbamoyl, butylcarbamoyl, phenyl-carbamoyl, methylcarbamoylamino, ethylcarbamoylamino, propylcarbamoylamino, butyl-carbamoylamino, phenylcarbamoylamino, methoxycarbamoylamino, ethoxycarbamoylamino, propylcarbamoylamino, butoxycarbamoylamino, phenoxycarbonyl, 2-(2-ethoxyethoxy)-ethoxy, 2-(2-ethoxyethoxy)ethylthio and 2-[2-methoxyethoxy)ethoxy]ethylthio.

39. The organic electroluminescence device of claim 38, wherein said central metal ion $M_1$ is selected from a group consisting of Al, Ga, In, Y, Sc, V, Co and Pb.

40. The organic electroluminescence device as claimed in claim 38, wherein said metal chelate complex is present as a dopant in the organic, luminous hole transporting layer at a concentration of 0.01 to 10% by weight.

41. An organic electroluminescence device, comprising:

an electron transporting layer in contact with an organic, luminous, hole transporting layer positioned between a pair of electrodes, at least one of said electrodes being translucent, wherein said organic, luminous, hole transporting layer is made of a material selected from the group consisting of a triphenylamine compound, a phthalocyanine compound, a pyrazoline compound, a thiophenol oligomer, a polythiophene compound, a polyparaphenylenevinylene, and a polyvinylcarbazole; and a part of said organic, luminous, hole transporting layer being doped with a metal chelate complex of formula (3) below in which the ligand is a N,N'-bissalicylidene-2,3-diaminobenzofuran (SABF):

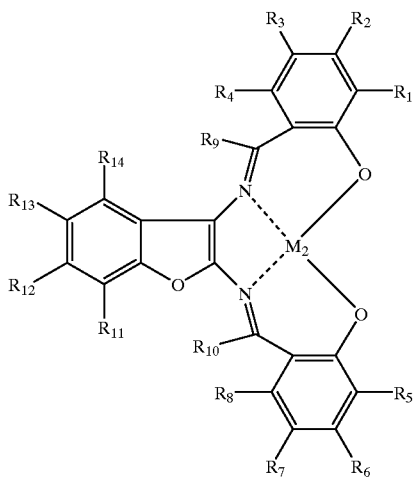

wherein $M_2$ is a central metal ion, and $R_1$ to $R_{14}$ are each independently selected from the group consisting of:

hydrogen, halogen, cyano, nitro, carboxyl, sulfone, acylamino, ester, mono- or di-substituted amino, alkoxy, mercapto, methyl, ethyl, propyl, butyl, sec-butyl, tert-butyl, pentyl, hexyl, heptyl, octyl, stearyl, trichloromethyl, aminomethyl, acetoxymethyl, acetoxyethyl, acetoxypropyl, acetoxybutyl, hydroxymethyl, hydroxyethyl, hydroxypropyl, hydroxybutyl, vinyl, styryl, acetylenyl, alkyloxy, alkylthio, aryloxy, arylthio, siloxy, acyl, cycloalkyl, carbamoyl, a substituted or unsubstituted acyclic hydrocarbon group, cyclopropyl, cyclohexyl, 1,3-cyclohexadienyl, 2-cyclopentene-1-yl, 2,4-cyclopentadiene-1-yl, phenyl, biphenylenyl, triphenylenyl, tetraphenylenyl, 2-methylphenyl, 3-nitrophenyl, 4-methylthiophenyl, 3,5-dicyanophenyl, o-, m- or p-tolyl, xylyl, o-, m- or p-cumyl, a substituted or unsubstituted mono- or polycyclic group selected from the group consisting of mesityl, pentalenyl, indenyl, naphthyl, azulenyl, heptalenyl, acenaphthylenyl, phenylenyl, fluorenyl, anthryl, anthraquinonyl, 3-methylanthryl, phenanthrolyl, triphenylenyl, pyrenyl, chrysenyl, 2-ethyl-1-chrysenyl, picenyl, perilenyl, 6-chloroperilenyl, pentaphenyl, pentacenyl, tetraphenylenyl, hexaphenyl, hexacenyl, rubicenyl, corronenyl, trinaphthylenyl, heptaphenyl, heptasenyl, pyranthrenyl, oparenyl, thienyl, furyl, pyrrolyl, imidazolyl, pyrazolyl, pyridyl, pyrazinyl, pyrimidinyl, pyridazinyl, indolyl, quinolyl, isoquinolyl, phthalazinyl, quinoxalynyl, quinazolynyl, carbazolyl, acrydinyl, phenadinyl, furfuryl, isothiazolyl, isoquinazolyl, furazenyl, phenoquinadinyl, benzthiazolyl, benzoxazlyl, benzoimidazolyl, 2-methylpyridyl, substituted or unsubstituted 3-cyanopyridyl group, a substituted or unsubstituted aromatic heterocyclic group, hydroxyl, methoxy, ethoxy, propoxy, butoxy, sec-butoxy, tert-butoxy, pentyloxy, hexyloxy, stearyloxy, phenoxy, methylthio, ethylthio, propylthio, butylthio, sec-butylthio, tert-butylthio, benzylthio, hexylthio, heptylthio, octylthio, phenylthio, amino, methylamino, dimethylamino, ethylamino, diethylamino, dipropylamino, dibutylamino, diphenylamino, bis(acetoxymethyl) amino, bis(acetoxyethyl)amino, bis(acetoxypropyl) amino, bis(acetoxybutyl)amino, dibenzylamino, methylsulfamoyl, dimethylsulfamoyl, ethyl-sulfamoyl, diethylsulfamoyl, propylsulfamoyl, butylsulfamoyl, phenylsulfamoyl, diphenyl-sulfamoyl, ethylcarbamoyl, diethylcarbamoyl, propylcarbamoyl, butylcarbamoyl, phenyl-carbamoyl, methylcarbamoylamino, ethylcarbamoylamino, propylcarbamoylamino, butyl-carbamoylamino, phenylcarbamoylamino, methoxycarbamoylamino, ethoxycarbamoylamino, propylcarbamoylamino, butoxycarbamoylamino, phenoxycarbonyl, 2-(2-ethoxyethoxy)-ethoxy, 2-(2-ethoxyethoxy)ethylthio and 2-[2-methoxyethoxy) ethoxy]ethylthio.

42. The organic electroluminescence device of claim 41, wherein said central metal ion $M_2$ is selected from a group consisting of Mg, Be, Ca and Zn.

43. The organic electroluminescence device as claimed in claim 41, wherein said metal chelate complex is present as a dopant in the organic, luminous, hole transporting layer at a concentration of 0.01 to 10% by weight.

44. An organic electroluminescence device, comprising:
an electron transporting layer in contact with an organic, luminous hole transporting layer positioned between a pair of electrodes, at least one of said electrodes being translucent, wherein said organic, luminous, hole transporting layer is made of a material selected from the group consisting of a triphenylamine compound, a phthalocyanine compound, a pyrazoline compound, a thiophenol oligomer, a polythiophene compound, a polyparaphenylenevinylene, and a polyvinylcarbazole; and a part of said organic, luminous, hole transporting layer being doped with a metal chelate complex of formula (4) as follows:

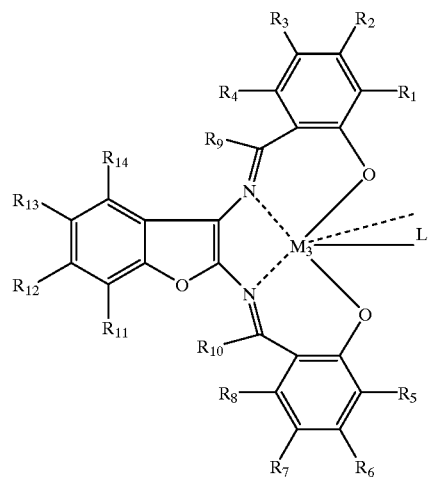

wherein $M_3$ is a central metal ion, L is another ligand, and $R_1$ to $R_{14}$ are each independently selected from the group consisting of:

hydrogen, halogen, cyano, nitro, carboxyl, sulfone, acylamino, ester, mono- or disubstituted amino, alkoxy, mercapto, methyl, ethyl, propyl, butyl, sec-butyl, tert-butyl, pentyl, hexyl, heptyl, octyl, stearyl, trichloromethyl, aminomethyl, acetoxymethyl, acetoxyethyl, acetoxypropyl, acetoxybutyl, hydroxymethyl, hydroxyethyl, hydroxypropyl, hydroxybutyl, vinyl, styryl, acetylenyl, alkyloxy, alkylthio, aryloxy, arylthio, siloxy, acyl, cycloalkyl, carbamoyl, a substituted or unsubstituted acyclic hydrocarbon group, cyclopropyl, cyclohexyl, 1,3- cyclohexadienyl, 2-cyclopentene-1-yl, 2,4-cyclopentadiene-1-yl, phenyl, biphenylenyl, triphenylenyl, tetraphenylenyl, 2-methylphenyl, 3-nitrophenyl, 4-methylthiophenyl, 3,5-dicyanophenyl, o-, m- or p-tolyl, xylyl, o-, m- or p-cumyl, a substituted or unsubstituted mono- or polycyclic group selected from the group consisting of mesityl, pentalenyl, indenyl, naphthyl, azulenyl, heptalenyl, acenaphthylenyl, phenylenyl, fluorenyl, anthryl, anthraquinonyl, 3-methylanthryl, phenanthrolyl, triphenylenyl, pyrenyl, chrysenyl, 2-ethyl-1-chrysenyl, picenyl, perilenyl, 6-chloroperilenyl, pentaphenyl, pentacenyl, tetraphenylenyl, hexaphenyl, hexacenyl, rubicenyl, corronenyl, trinaphthylenyl, heptaphenyl, heptasenyl, pyranthrenyl, oparenyl, thienyl, furyl, pyrrolyl, imidazolyl, pyrazolyl, pyridyl, pyrazinyl, pyrimidinyl, pyridazinyl, indolyl, quinolyl, isoquinolyl, phthalazinyl, quinoxalynyl, quinazolynyl, carbazolyl, acrydinyl, phenadinyl, furfuryl, isothiazolyl, isoquinazolyl, furazenyl, phenoquinadinyl, benzthiazolyl, benzoxazlyl, benzoimidazolyl and 2-methylpyridyl; a substituted or unsubstituted 3-cyanopyridyl group, hydroxyl, methoxy, ethoxy, propoxy, butoxy, sec-butoxy, tert-butoxy, pentyloxy, hexyloxy, stearyloxy, phenoxy, methylthio, ethylthio, propylthio, butylthio, sec-butylthio, tert-butylthio, benzylthio, hexylthio, heptylthio, octylthio, phenylthio, amino, methylamino, dimethylamino, ethylamino, diethylamino, dipropylamino, dibutylamino, diphenylamino, bis(acetoxymethyl)amino, bis(acetoxyethyl)amino, bis(acetoxypropyl)amino, bis(acetoxybutyl)amino, dibenzylamino, methylsulfamoyl, dimethylsulfamoyl, ethyl-sulfamoyl, diethylsulfamoyl, propylsulfamoyl, butylsulfamoyl, phenylsulfamoyl, diphenyl-sulfamoyl, ethylcarbamoyl, diethylcarbamoyl, propylcarbamoyl, butylcarbamoyl, phenyl-carbamoyl, methylcarbamoylamino, ethylcarbamoylamino, propylcarbamoylamino, butylcarbamoylamino, phenylcarbamoylamino, methoxycarbamoylamino, ethoxycarbamoylamino, propylcarbamoylamino, butoxycarbamoylamino, phenoxycarbonyl, 2-(2-ethoxyethoxy)-ethoxy, 2-(2-ethoxyethoxy)ethylthio and 2-[2-methoxyethoxy)ethoxy]ethylthio.

45. The organic electroluminescence device of claim 44, wherein said central metal ion $M_3$ is selected from a group consisting of Mg, Be, Ca, Zn, Al, Ga, In, Sr, Y, Sc, Ti, Zr, Cd, Ba, Sn, V, Co and Pb.

46. The organic electroluminescence device of claim 44, wherein said ligand L is a member selected from the group consisting of phenol, 4-phenylphenol, 2-methyl-8-quinolinol, 8-quinolinol, 5-chloro-8-quinolinol, 10-hydroxybenzene [h] quinoline, an oxazole, an oxadiazole, an oxathiazole, a triazole, a coumarin, a quinacridone, a quinaldine, a pyrene, a styrylbenzene, an aromatic amine, an aliphatic amine and an aliphatic alcohol.

47. The organic electroluminescence device as claimed in claim 44, wherein said metal chelate complex is present as a dopant in the organic, luminous, hole transporting layer at a concentration of 0.01 to 10% by weight.

* * * * *